(12) United States Patent
Yu et al.

(10) Patent No.: US 11,777,019 B2
(45) Date of Patent: Oct. 3, 2023

(54) LATERAL HETEROJUNCTION BIPOLAR TRANSISTOR WITH IMPROVED BREAKDOWN VOLTAGE AND METHOD

(71) Applicant: GlobalFoundries U.S. Inc., Malta, NY (US)

(72) Inventors: Hong Yu, Clifton Park, NY (US); Vibhor Jain, Williston, VT (US); Judson R. Holt, Ballston Lake, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 37 days.

(21) Appl. No.: 17/586,862

(22) Filed: Jan. 28, 2022

(65) Prior Publication Data
US 2023/0102573 A1 Mar. 30, 2023

Related U.S. Application Data

(60) Provisional application No. 63/273,303, filed on Oct. 29, 2021, provisional application No. 63/249,049, filed on Sep. 28, 2021.

(51) Int. Cl.
*H01L 29/737* (2006.01)
*H01L 29/08* (2006.01)
(Continued)

(52) U.S. Cl.
CPC ........ *H01L 29/737* (2013.01); *H01L 29/0821* (2013.01); *H01L 29/66242* (2013.01); *H01L 29/735* (2013.01)

(58) Field of Classification Search
CPC ............... H01L 29/737; H01L 29/0821; H01L 29/66242; H01L 29/735; H01L 29/0808; H01L 29/0817; H01L 29/7317
See application file for complete search history.

(56) References Cited

U.S. PATENT DOCUMENTS 6,949,764 B2  9/2005 Ning
8,288,758 B2  10/2012 Ning et al.
(Continued)

FOREIGN PATENT DOCUMENTS

DE  112011103569 T5  9/2013
EP      1094523 A2   4/2001
(Continued)

OTHER PUBLICATIONS

European Search Report for corresponding EP Application No. 22198490.9 dated Feb. 13, 2023, 8 pages.

*Primary Examiner* — Syed I Gheyas
(74) *Attorney, Agent, or Firm* — Francois Pagette; Hoffman Warnick LLC

(57) ABSTRACT

Disclosed is a semiconductor structure including a device, such as a lateral heterojunction bipolar transistor (HBT), made up of a combination of at least three different semiconductor materials with different bandgap sizes for improved performance. In the device, a base layer of the base region can be positioned laterally between a collector layer of a collector region and an emitter layer of an emitter region and can be physically separated therefrom by buffer layers. The base layer can be made of a narrow bandgap semiconductor material, the collector layer and, optionally, the emitter layer can be made of a wide bandgap semiconductor material, and the buffer layers can be made of a semiconductor material with a bandgap between that of the narrow bandgap semiconductor material and the wide bandgap semiconductor material. Also disclosed herein is a method of forming the structure.

20 Claims, 18 Drawing Sheets

(51) Int. Cl.
*H01L 29/66* (2006.01)
*H01L 29/735* (2006.01)

(56) References Cited

U.S. PATENT DOCUMENTS

| | | |
|---|---|---|
| 8,420,493 B2 | 4/2013 | Ning et al. |
| 8,586,441 B1 | 11/2013 | Cai et al. |
| 10,825,921 B2 | 11/2020 | Balakrishnan et al. |
| 2001/0011729 A1 | 8/2001 | Singh et al. |
| 2015/0263091 A1* | 9/2015 | Hashemi ............ H01L 29/0821 |
| | | 257/191 |
| 2019/0165150 A1 | 5/2019 | Hashemi et al. |

FOREIGN PATENT DOCUMENTS

| | | |
|---|---|---|
| EP | 1094523 A3 | 6/2003 |
| EP | 2454756 B1 | 5/2012 |

* cited by examiner

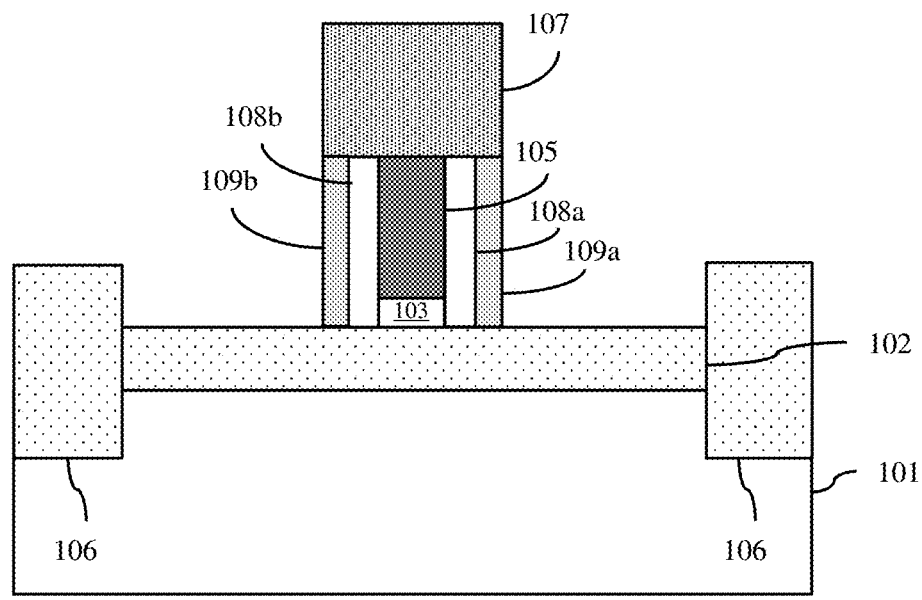
FIG. 11A(1)
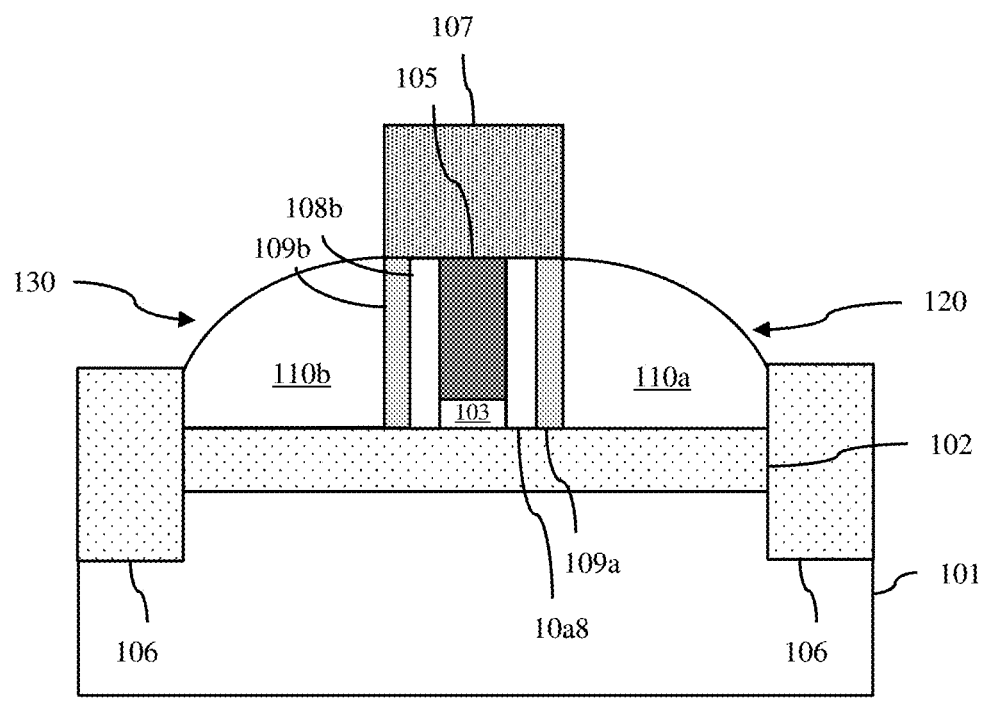
FIG. 11A(2)

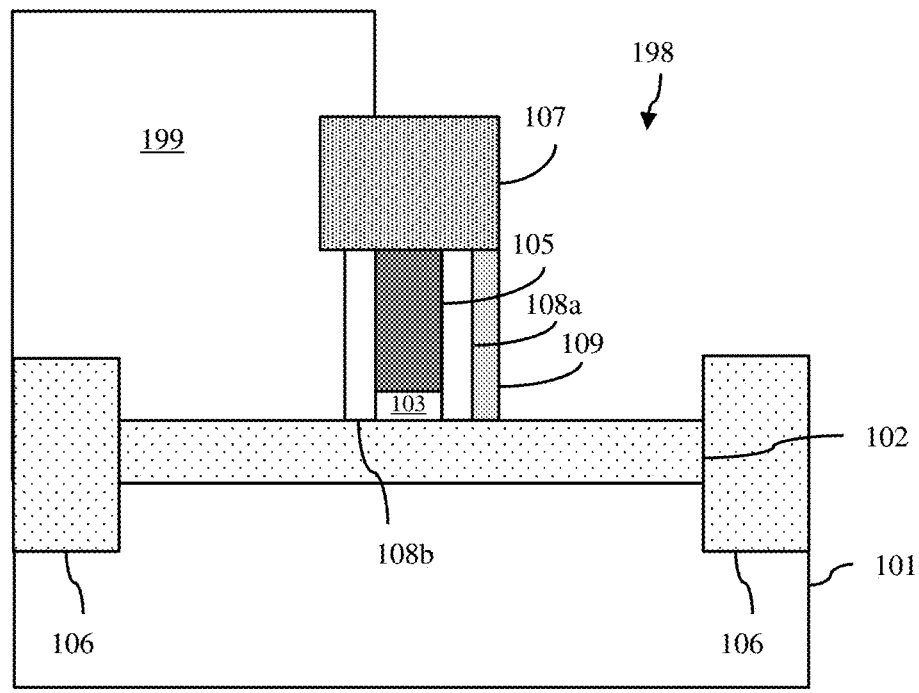
FIG. 11C(1)
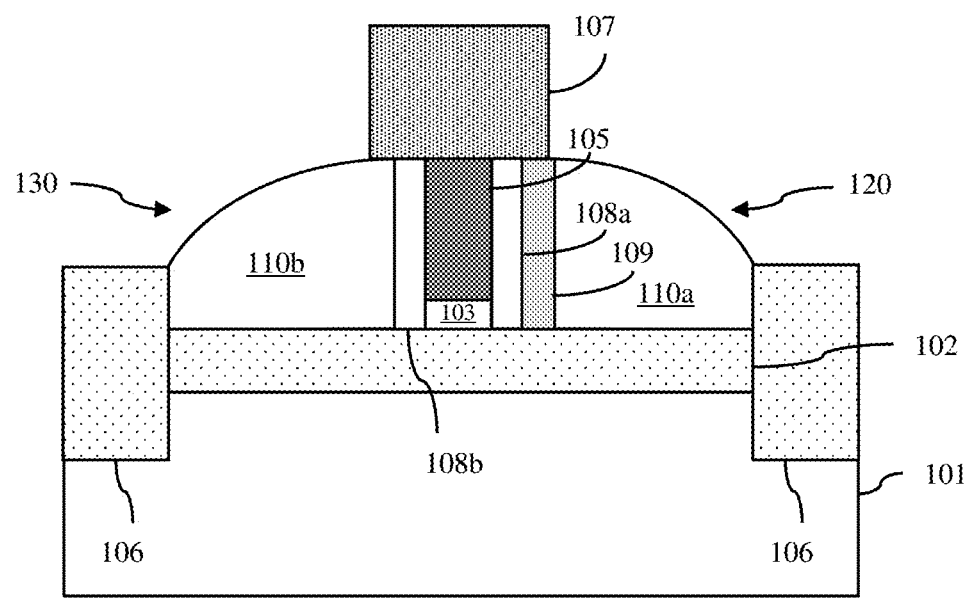
FIG. 11C(2)

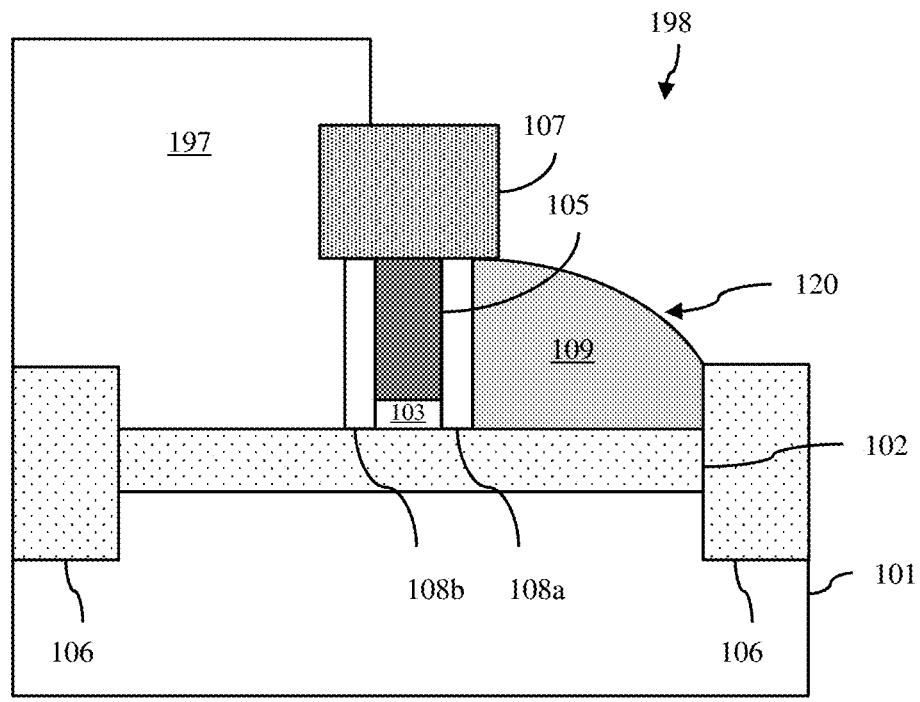
FIG. 11D(1)
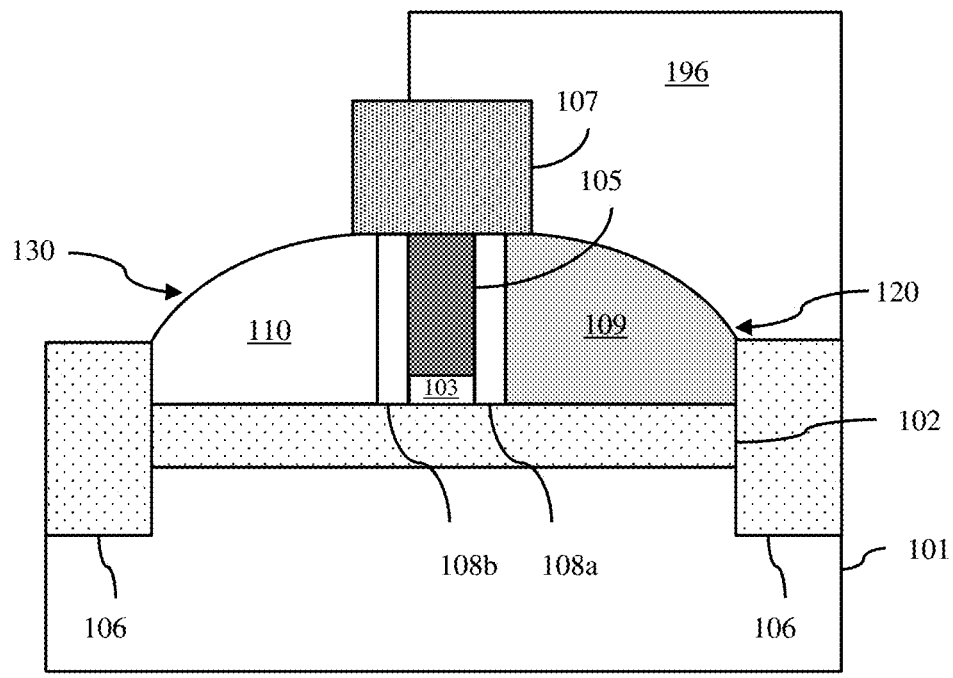
FIG. 11D(2)

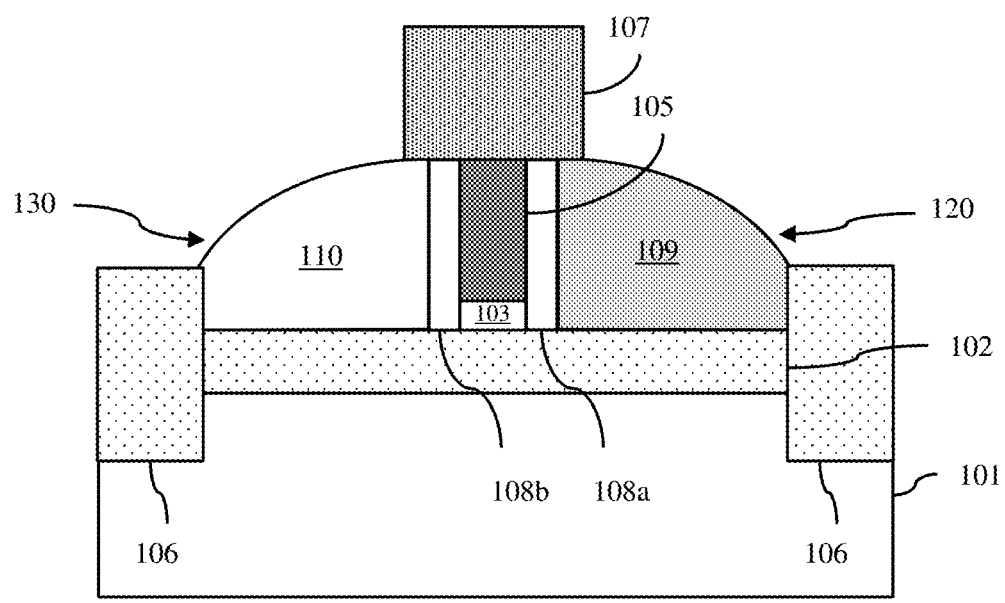
FIG. 11D(3)

LATERAL HETEROJUNCTION BIPOLAR TRANSISTOR WITH IMPROVED BREAKDOWN VOLTAGE AND METHOD

BACKGROUND

Field of the Invention

The present invention relates semiconductor structures and methods of forming semiconductor structures.

Description of Related Art

Advantages associated with manufacturing complementary metal oxide semiconductor (CMOS) designs using advanced silicon-on-insulator (SOI) processing technology platforms (e.g., a fully-depleted silicon-on-insulator (FD-SOI) processing technology platform) include, for example, reduced power, reduced area consumption, reduced cost, high performance, multiple core threshold voltage (Vt) options, etc. CMOS designs manufactured on such SOI wafers are used in a variety of applications including, but not limited to, Internet-of-Things (IOT) devices, wearable devices, smartphone processors, automotive electronics, and radio frequency integrated circuits (RFICs) (including millimeter wave (mmWave) ICs). These same applications could benefit from the inclusion of bipolar junction transistors (BJTs) because BJTs tend to have more drive and are generally considered better suited for analog functions than field effect transistors (FETs). However, BJTs are typically formed as vertical devices (e.g., with an in-substrate collector, a base aligned above the collector, and an emitter aligned above the base) and such vertical BJTs are not easily incorporated into advanced SOI processing technology platforms. Recently, lateral BJTs have been developed that can be incorporated into advanced SOI technology platforms along with CMOS devices but at the expense of performance (e.g., low cut-off frequency (fT)/maximum oscillation frequency (fmax) and beta cut-off frequency, low breakdown voltage (BV), etc.).

SUMMARY

Disclosed herein are embodiments of a semiconductor structure. The semiconductor structure can include a base region. The base region can include a base layer. The semiconductor structure can further include a buffer layer, which is positioned laterally immediately adjacent to the base layer. The semiconductor structure can further include a collector region, which includes a collector layer positioned laterally immediately adjacent to the buffer layer. In this semiconductor structure the base layer, the buffer layer, and the collector layer can be made of different semiconductor materials with different bandgap sizes.

Some embodiments of a semiconductor structure disclosed here can specifically include a multi-layered collector region. For example, the semiconductor structure can include a base region. The base region can include a base layer. The semiconductor structure can further include a buffer layer, which is positioned laterally immediately adjacent to the base layer. The semiconductor structure can further include a collector region, which includes a collector layer positioned laterally immediately adjacent to the buffer layer and an additional collector layer positioned laterally immediately adjacent to the collector layer. In this semiconductor structure the base layer, the buffer layer, and the collector layer can also be made of different semiconductor materials with different bandgap sizes.

Also disclosed herein are embodiments of a method for forming the above-described semiconductor structure. The method can include forming a base region that includes a base layer. The method can further include forming buffer layer such that it is positioned laterally immediately adjacent to the base layer. The method can further include forming a collector region that includes a collector layer positioned laterally immediately adjacent to the buffer layer. Additionally, in the method, the processes of forming the base region, forming the buffer layer and forming the collector region can be performed such that the base layer, the buffer layer, and the collector layer are made of different semiconductor materials with different bandgap sizes.

BRIEF DESCRIPTION OF THE SEVERAL VIEWS OF THE DRAWINGS

The present invention will be better understood from the following detailed description with reference to the drawings, which are not necessarily drawn to scale and in which:

FIGS. 11A(1)-11A(2) are cross-section diagrams illustrating partially completed semiconductor structures formed at process 222 specifically during manufacture of the structure FIG. 1A;

FIGS. 11C(1)-11C(2) are cross-section diagrams illustrating partially completed semiconductor structures formed at process 222 specifically during manufacture of the structure shown in FIG. 1C; and FIGS. 11D(1)-11D(3) are cross-section diagrams illustrating partially completed semiconductor structures formed at process 222 specifically during manufacture of the structure shown in FIG. 1D.

DETAILED DESCRIPTION

Figure 1A:
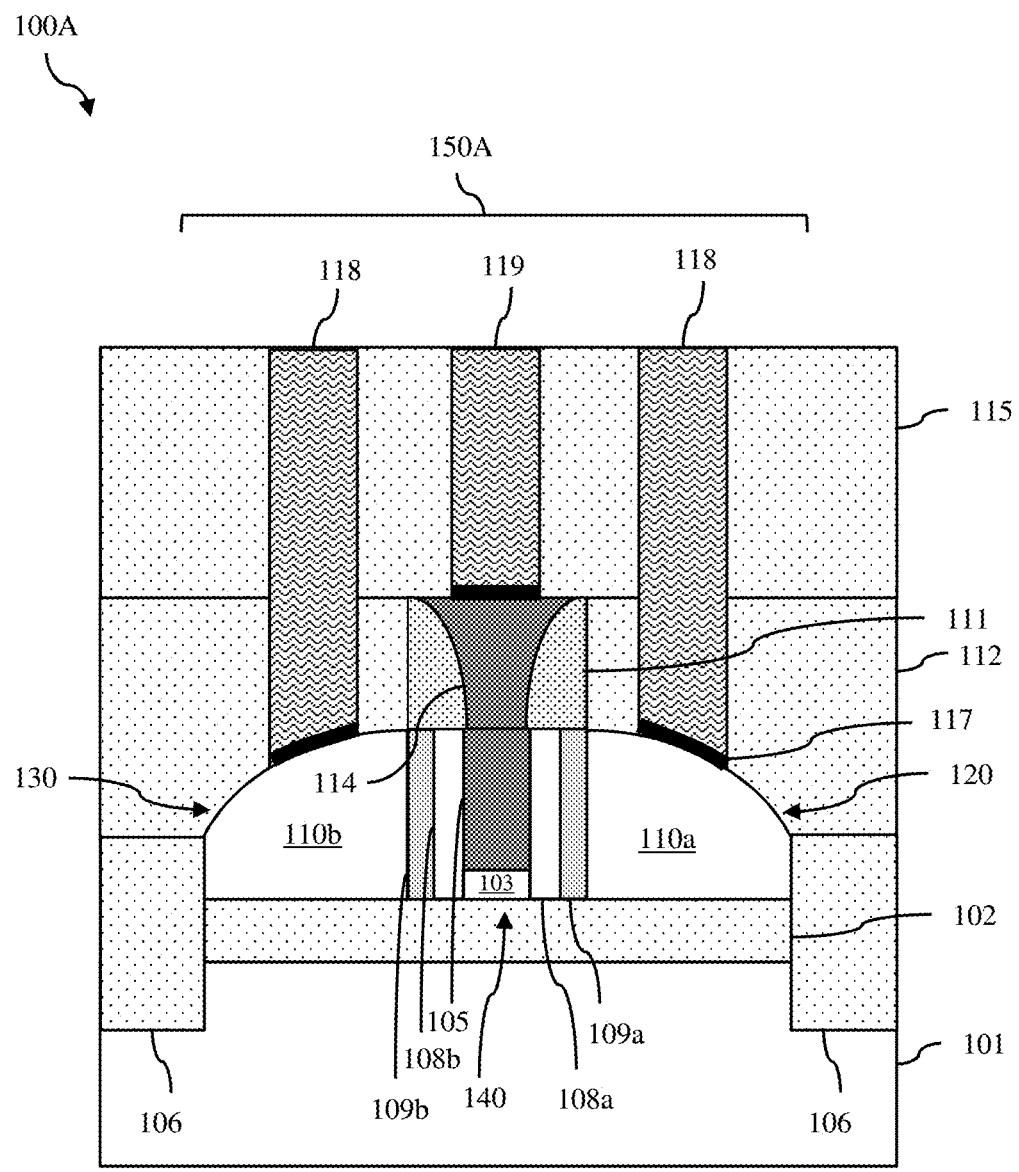
FIGS. 1A-1D are cross-section diagrams illustrating different embodiments of a semiconductor structure including a lateral heterojunction bipolar transistor (HBT) configured for improved performance.

As mentioned above, lateral bipolar junction transistors (BJTs) have been developed that can be incorporated into advanced silicon-on-insulator (SOI) technology platforms along with complementary metal oxide semiconductor (CMOS devices) but at the expense of performance (e.g., low cut-off frequency (fT)/maximum oscillation frequency (fmax) and beta cut-off frequency, low breakdown voltage (BV), etc.).

In view of the foregoing, disclosed herein are embodiments of a semiconductor structure including a device, such as a lateral heterojunction bipolar transistor (HBT), made up of a combination of at least three different semiconductor materials with different bandgap sizes, respectively, for improved performance (e.g., to increase cut-off frequency (fT)/maximum oscillation frequency (fmax) and beta cut-off frequency and to increase breakdown voltage (BV)). In the device, a base layer of a base region can be positioned laterally between a collector layer of a collector region and an emitter layer of an emitter region and can be physically separated therefrom by buffer layers. The base layer can be made of a narrow bandgap semiconductor material, the collector layer and, optionally, the emitter layer can be made of a wide bandgap semiconductor material, and the buffer layers can be made of another semiconductor material with a medium bandgap between that of the narrow bandgap semiconductor material and the wide bandgap semiconductor material. Also disclosed herein are method embodiments for forming the semiconductor structure.

More specifically, referring to FIGS. 1A-1D, disclosed herein are embodiments of a semiconductor structure 100A-100D, respectively. The semiconductor structure 100A-100D can be, for example, a semiconductor-on-insulator structure (e.g., a silicon-on-insulator (SOI) structure). That is, the semiconductor structure 100A-100D can include a semiconductor substrate 101. The semiconductor substrate 101 can be, for example, a silicon substrate that is monocrystalline in structure. Optionally, the semiconductor substrate 101 can be doped so as to have P-type conductivity at a relatively low conductivity level. Thus, for example, the semiconductor substrate 101 could be a P− silicon substrate. Optionally, the semiconductor substrate 101 can include a buried well (not shown, also referred to as a buried dopant implant region). The buried well could be doped so as to have P-type conductivity (e.g., so as to be a buried Pwell). Alternatively, the buried well could be doped so as to have N-type conductivity (e.g., so as to be a buried Nwell).

The semiconductor structure 100A-100D can further include an insulator layer 102 on the top surface of the semiconductor substrate 101. The insulator layer 102 can be, for example, a silicon dioxide layer (also referred to herein as a buried oxide (BOX) layer) or a layer of any other suitable insulator material.

The semiconductor structure 100A-100D can further include a semiconductor layer on the insulator layer 102. The semiconductor layer can be, for example, a silicon layer that is monocrystalline in structure. The semiconductor structure 100A-100D can further include isolation structures (e.g., shallow trench isolation (STI) regions 106)) that extend vertically through the semiconductor layer and to or, optionally, through the insulator layer 102 so as to define an active device region.

The semiconductor structure 100A-100D can further include a transistor and, particularly, a lateral heterojunction bipolar transistor (HBT) 150A-150D, respectively, in the active device region. Those skilled in the art will recognize that, like a conventional bipolar junction transistor (BJT), an HBT includes a base region with one type conductivity between an emitter region and a collector region with another type conductivity. However, instead of using the same semiconductor material for all three regions, in an HBT different semiconductor materials are used for the emitter-base junction and the base-collector junction. Those skilled in the art will recognize that an HBT is generally considered able to handle higher frequency operations than a BJT.

The HBT 150A-150D can be an NPN-type HBT or, alternatively, a PNP-type HBT. In the below description of the HBT, reference is made to semiconductor layers and/or regions being doped so as to have a first-type conductivity or a second-type conductivity that is different from the first-type conductivity. It should be understood that the first-type conductivity and the second-type conductivity are either P-type conductivity and N-type conductivity, respectively, or N-type conductivity and P-type conductivity, respectively, depending upon whether the HBT is an NPN-type HBT or a PNP-type HBT. Specifically, if the HBT is an NPN-type HBT, then the first-type conductivity refers to P-type conductivity and the second-type conductivity refers to N-type conductivity. However, if the HBT is a PNP-type HBT, then the first-type conductivity refers to N-type conductivity and the second-type conductivity refers to P-type conductivity. See the detailed discussion below regarding different dopants that can be employed in semiconductor materials to achieve P-type conductivity or N-type conductivity.

In any case, the HBT 150A-150D can include a base region 140. The base region 140 can include a relatively thin and narrow section of the semiconductor layer on the insulator layer 102 (referred to herein as the seed layer 103). This seed layer 103 can be doped so as to have a first-type conductivity at a relatively low conductivity level. For example, the seed layer 103 can be a P− seed layer in the case of an NPN-type HBT or an N− seed layer in the case of a PNP-type HBT.

The base region 140 including a base layer 105 above and immediately adjacent to the seed layer 103 (i.e., on but separated from the insulator layer 102 by the seed layer 103). This base layer 105 can be a semiconductor layer, which has been selectively epitaxially grown from the seed layer 103 during processing such that it is monocrystalline in structure. The base layer 105 can be made of a semiconductor material with a relatively narrow (i.e., small) bandgap as compared to, for example, silicon. Thus, the base layer 105 can be, for example, a monocrystalline silicon germanium layer. The base layer 105 can be undoped or, alternatively, doped so as to have the first-type conductivity. For example, for an NPN-type HBT, the base layer 105 can be undoped (i.e., an intrinsic base layer). Alternatively, for an NPN-type HBT, the base layer 105 can be doped so as to have P-type conductivity at a relatively low conductivity level (i.e., a P− base layer), so as to have a graded P-type profile (e.g., from undoped or P− at the bottom surface near the seed layer 103 to P or P+ at the top surface), or so as to have P-type conductivity at a relatively high conductivity level (i.e., a P+ base layer). Similarly, for a PNP-type HBT, the base layer 105 can be undoped (i.e., an intrinsic base layer). Alternatively, for a PNP-type HBT, the base layer 105 can be doped so as to have N-type conductivity at a relatively low conductivity level (i.e., an N− base layer), so as to have a graded N-type profile (e.g., from undoped or N− at the bottom surface near the seed layer 103 to N or N+ at the top surface), or so as to have N-type conductivity at a relatively high conductivity level (i.e., a N+ base layer). As discussed in greater detail below, the base layer 105 can be positioned laterally between a collector region 120 and an emitter region 130 and further separated therefrom by buffer layers (i.e., a collector-side buffer layer 108a and an emitter-side buffer layer 108b).

The base region 140 can further include an additional base layer 114 (also referred to herein as an extrinsic base layer) above and immediately adjacent to the base layer 105. This additional base layer 114 can be another semiconductor layer, which has been either selectively or non-selectively epitaxially grown during processing such that it is either monocrystalline or polycrystalline in structure (as discussed further below with regard to the method). The additional base layer 114 can be made of the same semiconductor material as the base layer 105 (e.g., silicon germanium) such that it too has a relatively narrow bandgap as compared to, for example, silicon. Alternatively, the additional base layer 114 can be made of a different semiconductor material that the base layer 105 (e.g., silicon).

In any case, the additional base layer 114 can be doped so as to have the first-type conductivity at a relatively high conductivity level. For example, for an NPN-type HBT, the additional base layer 114 can be a P+ base layer; whereas, for a PNP-type HBT, the additional base layer 114 can be an N+ base layer. The additional base layer 114 can be contacted (e.g., see base contact 119). The additional base layer 114 can be positioned laterally between dielectric sidewall spacers 111, which are on the buffer layers 108a-108b and which can optionally extend laterally onto the emitter region 130 and collector region 120. The dielectric sidewall spacers 111 can be made, for example, of silicon nitride, silicon carbon nitride, silicon boron carbon nitride or any other suitable sidewall spacer material.

As mentioned above, the base layer 105 can be positioned laterally between a collector region 120 and an emitter region 130 and further separated therefrom by buffer layers (i.e., a collector-side buffer layer 108a and an emitter-side buffer layer 108b). More specifically, the base layer 105-seed layer 103 stack can have an essentially uniform width with opposing sidewalls. The HBT 150A-150D can further include relatively thin buffer layers 108a-108b covering the opposing sidewalls of this stack so that the seed layer 103 is positioned laterally between and immediately adjacent to the buffer layers 108a and 108b on either side of the stack and, similarly, so that the base layer 105 is positioned laterally between and immediately adjacent to the buffer layers 108a and 108b on either side of the stack. The buffer layers 108a and 108b can be layers of the same semiconductor material, which are concurrently selectively epitaxially grown from the opposing sidewalls of the base layer 105-seed layer 103 stack during processing such that they are monocrystalline in structure. The semiconductor material of the buffer layers 108a and 108b can specifically be selected during processing so as to have a wider (i.e., larger) bandgap than the base layer 105, but so as to also have an equal or approximately equal lattice constant to that of the base layer 105. Thus, for example, if the base layer 105 is a silicon germanium layer, then the semiconductor material of the buffer layers 108a and 108b could be silicon, aluminum phosphide, gallium phosphide, or any other suitable semiconductor material with a larger bandgap but similar lattice constant as compared to silicon germanium. In any case, the buffer layers 108a and 108b can have a second-type conductivity, which is different from the first-type conductivity. Optionally, the second-type conductivity level of the buffer layers 108a and 108b can be relatively low. For example, for an NPN-type HBT, the buffer layers 108a and 108b can be a N− buffer layers (e.g., effectively forming N− collector/emitter extension regions); whereas, for a PNP-type HBT, the buffer layers 108a and 108b can be P− buffer layers (e.g., effectively forming P− collector/emitter extension regions).

In each of the embodiments, the collector region 120 can be positioned laterally adjacent to the buffer layer 108a and the emitter region 130 can be positioned laterally adjacent to the buffer layer 108b. As discussed in greater detail below, in some embodiments, the HBT can be symmetric and, particularly, the collector region 120 and the emitter region 140 thereof can be essentially symmetric (e.g., see the HBTs 150A and 150B of the semiconductor structures 100A and 100B of FIGS. 1A and 1B, respectively). In other embodiments, the HBT can be asymmetric and, particularly, the collector region 120 and the emitter region 130 thereof can be asymmetric (e.g., see the HBTs 150C and 150D of the semiconductor structures 100C and 100D of FIGS. 1C and 1D, respectively). In any case, in each of the embodiments, the collector region 120 can include at least one collector layer, which is immediately adjacent to the buffer layer 108a, which is selectively epitaxially and laterally grown from a sidewall of the buffer layer 108a during processing such that it is monocrystalline in structure, and which is made of a semiconductor material that has a wider (i.e., larger) bandgap than the buffer layer 108a and that further has a smaller lattice constant than the buffer layer 108a (e.g., see the collector layer 109a in collector region 120 of the symmetric HBTs 150A and 150B of the semiconductor structures 100A and 100B of FIGS. 1A and 1B; see also the collector layer 109 in collector region 120 of the asymmetric HBTs 150C and 150D of the semiconductor structures 100C and 100C of FIGS. 1C and 1D).

More specifically, in the symmetric HBT 150A in the semiconductor structure 100A of FIG. 1A, the collector and emitter regions 120 and 130 can have collector and emitter layers 109a and 109b, respectively. These collector and emitter layers 109a and 109b can be symmetric, can be positioned laterally immediately adjacent to the buffer layers 108a and 108b, respectively, on either side of the base, can be epitaxially, selectively, and laterally grown from the buffer layers so as to be monocrystalline in structure, and can be made of a semiconductor material that has a wider (i.e., larger) bandgap and smaller lattice constant than the buffer layers. Thus, for example, if the base layer 105 is made of silicon germanium and the buffer layers 108a and 108b are made of silicon, aluminum phosphide, or gallium phosphide, then the collector and emitter layers 109a and 109b could be made of silicon carbide, gallium nitride, zinc oxide, aluminum nitride or any other suitable semiconductor material with a wider bandgap and smaller lattice constant that the buffer layers. In the symmetric HBT 150A in the semiconductor structure 100A of FIG. 1A, the collector and emitter layers 109a and 109b can be relatively thin and essentially vertically-oriented and the collector and emitter regions 120 and 130 can further have additional collector and emitter layers 110a and 110b positioned laterally adjacent to the collector and emitter layers 109a and 109b, respectively. Specifically, these additional collector and emitter layers 110a and 110b can be symmetric, can be positioned laterally immediately adjacent to the collector and emitter layers 109a and 109b, respectively, can be epitaxially, selectively, and laterally grown from the collector and emitter layers 109a and 109b so as to be monocrystalline in structure, and can be made of a semiconductor material with a narrower (i.e., smaller) bandgap than the collector and emitter layers 109a and 109b, but still a wider (i.e., larger) bandgap than the base layer 105. Thus, for example, if the base layer 105 is made of silicon germanium, the buffer layers 108a and 108b are made of silicon, aluminum phosphide, or gallium phosphide and the collector and emitter layers 109a and 109b are made of silicon carbide, gallium nitride, zinc oxide, or aluminum nitride, then the additional collector and emitter layers 110a and 110b could be made of silicon. It should be noted that, in the symmetric HBT 150A, the additional collector and emitter layers 110a and 110b can be relatively wide and contacted (e.g., see collector/emitter contacts 118).

Figure 1B:
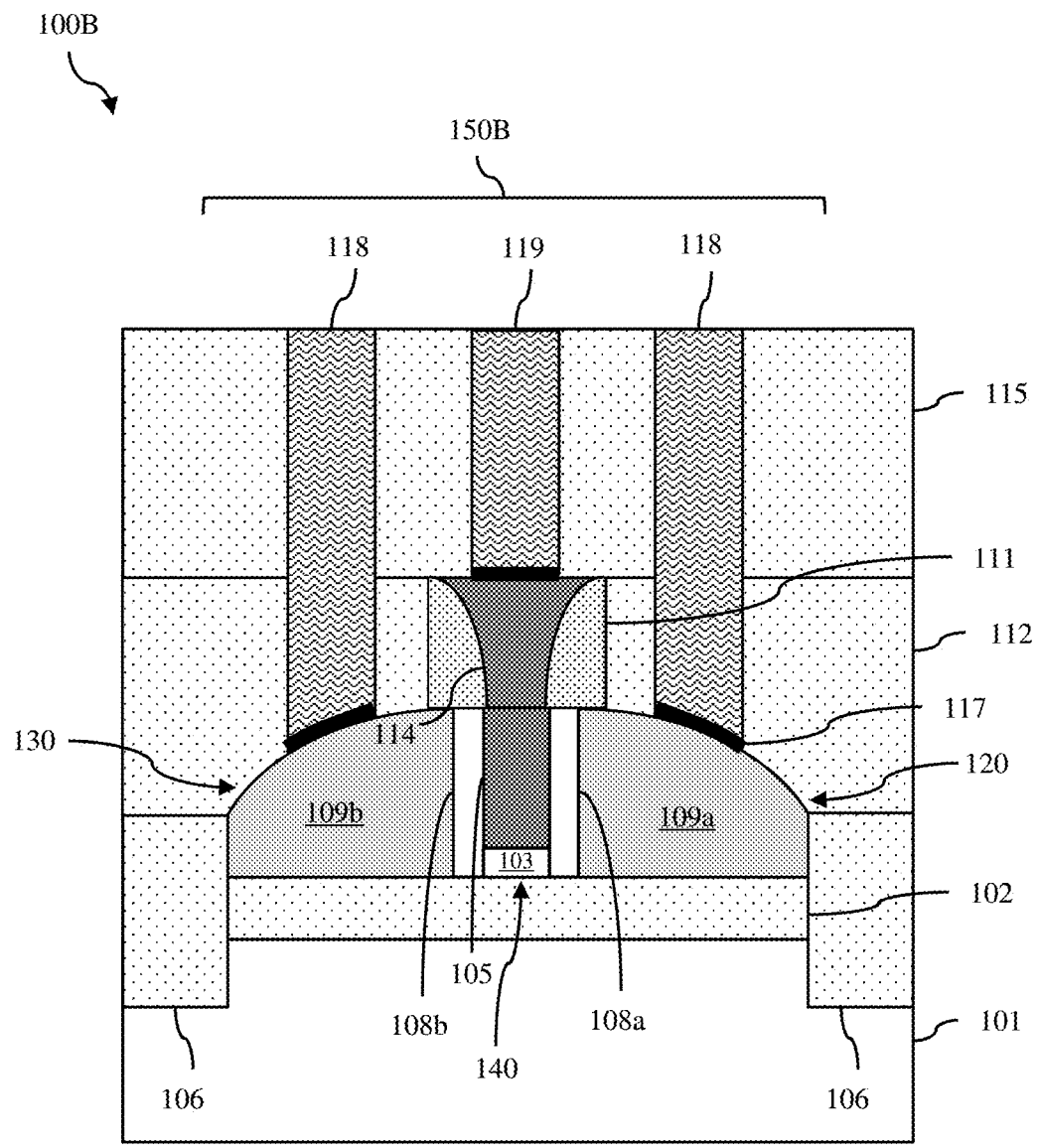

Alternatively, in the symmetric HBT 150B in the semiconductor structure 100B of FIG. 1B, the collector region 120 can have a single collector layer 109a and the emitter region 130 can have a single emitter layer 109b. These collector and emitter layers 109a and 109b can be symmetric, can be positioned laterally immediately adjacent to the buffer layers 108a and 108b, respectively, on either side of the base, can be epitaxially, selectively, and laterally grown from the buffer layers so as to be monocrystalline in structure, and can be made of a semiconductor material that has a wider (i.e., larger) bandgap and smaller lattice constant than the buffer layers. Thus, for example, if the base layer 105 is made of silicon germanium and the buffer layers 108a and 108b are made of silicon, aluminum phosphide, or gallium phosphide, then the collector and emitter layers 109a and 109b could be made of silicon carbide, gallium nitride, zinc oxide, aluminum nitride or any other suitable semiconductor material with a wider bandgap and smaller lattice constant that the buffer layers 108a and 108b. It should be noted that, in the symmetric HBT 150B, the collector and emitter layers 109a and 109b can be relatively wide and contacted (e.g., see collector/emitter contacts 118).

Figure 1C:
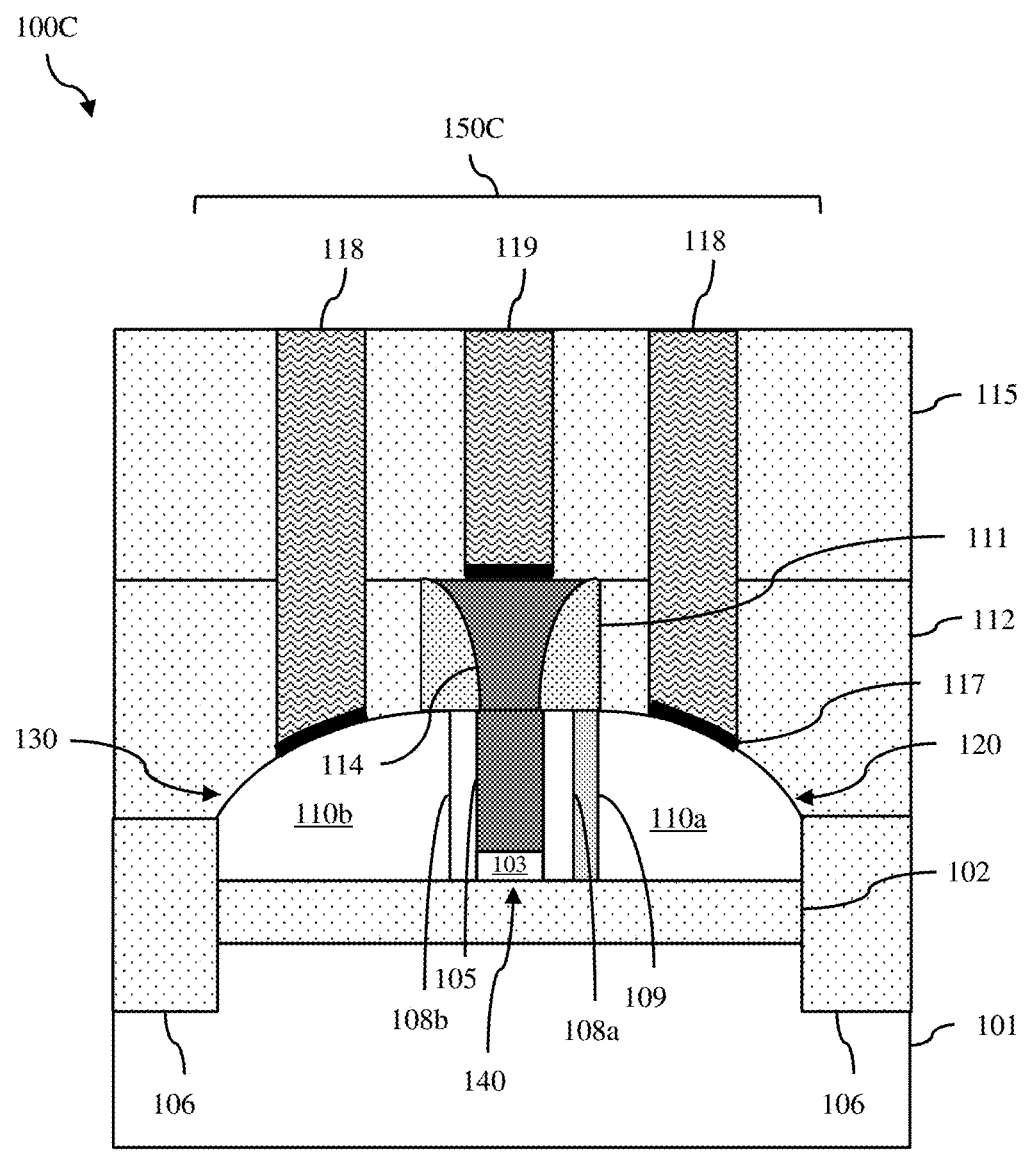

Alternatively, in the asymmetric HBT 150C in the semiconductor structure 100C of FIG. 1C, the collector region 120 can include a wide bandgap material and the emitter region 130 can be devoid of any wide bandgap materials. Specifically, the collector region 120 can include a collector layer 109. The collector layer 109 can be positioned laterally immediately adjacent to the buffer layer 108a, can be epitaxially, selectively, and laterally grown from the buffer layer 108a so as to be monocrystalline in structure, and can be made of a semiconductor material that has a wider (i.e., larger) bandgap and smaller lattice constant than the buffer layer 108a. Thus, for example, if the base layer 105 is made of silicon germanium and the buffer layer 108a is made of silicon, aluminum phosphide, or gallium phosphide, then the collector layer 109 could be made of silicon carbide, gallium nitride, zinc oxide, aluminum nitride or any other suitable semiconductor material with a wider bandgap and smaller lattice constant that the buffer layers. The collector layer 109 can further be relatively thin and essentially vertically-oriented and the collector region 120 can include an additional collector layer 110a. The additional collector layer 110a can be positioned laterally immediately adjacent to the collector layer 109, can be epitaxially, selectively, and laterally grown from the collector layer 109 so as to be monocrystalline in structure, and can be made of a semiconductor material with a narrower (i.e., smaller) bandgap than the collector layer 109, but still a wider (i.e., larger) bandgap than the base layer 105. Thus, for example, if the base layer 105 is made of silicon germanium, the buffer layer 108a is made of silicon, aluminum phosphide, or gallium phosphide and the collector layer 109 is made of silicon carbide, gallium nitride, zinc oxide, or aluminum nitride, then the additional collector layer 110a could be made of silicon. In this case, the emitter region 130 can be devoid of the wide bandgap material layer and instead can include a single emitter layer 110b, which is positioned laterally immediately adjacent to the buffer layer 108b, which is epitaxially, selectively, and laterally grown from the buffer layer 108b so as to be monocrystalline in structure, and which is made of the same semiconductor material as the additional collector layer 110a. It should be noted that, in the asymmetric HBT 150C, the additional collector layer 110a and the emitter layer 110b can be relatively wide and contacted (e.g., see collector/emitter contacts 118).

Figure 1D:
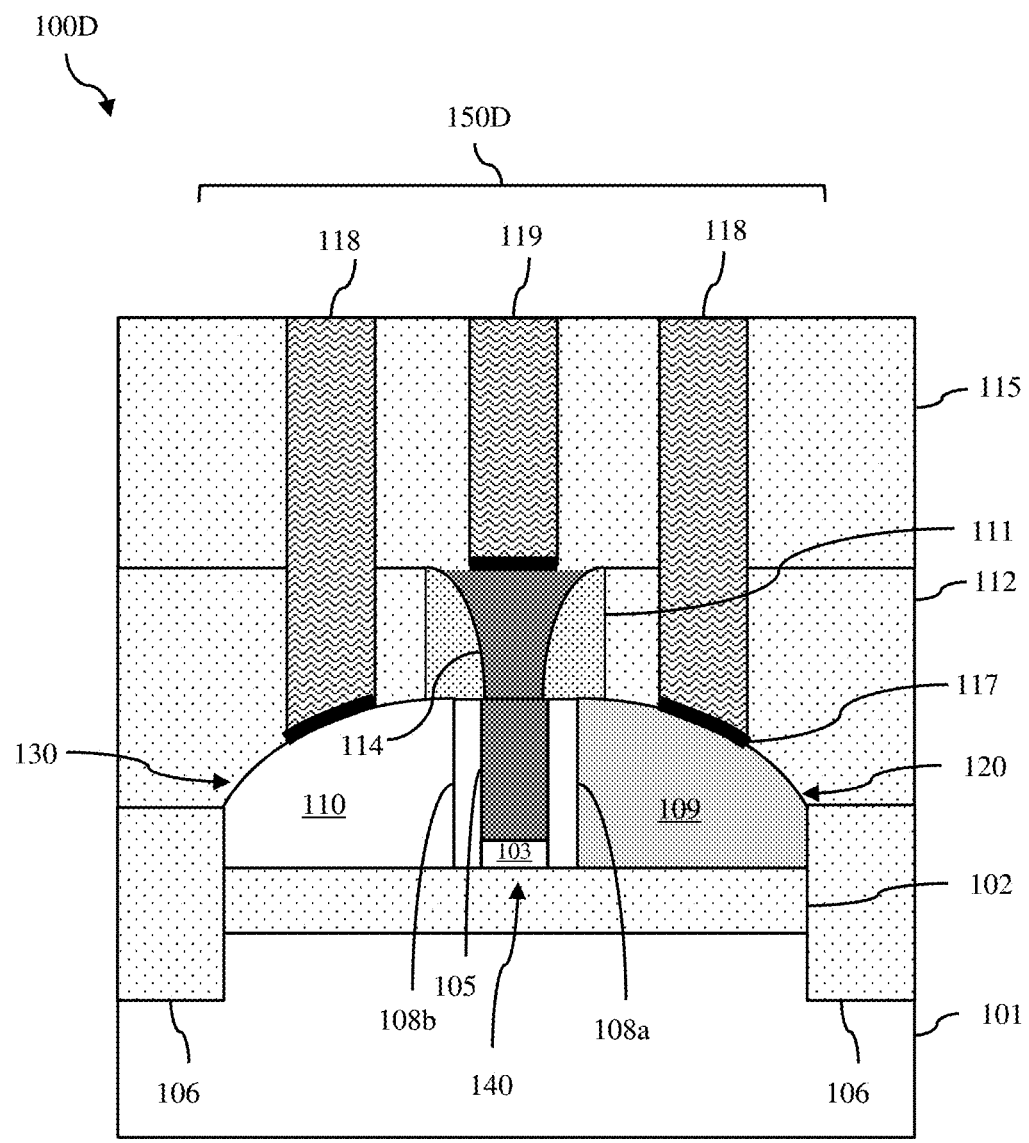

Alternatively, in the asymmetric HBT 150D in the semiconductor structure 100D of FIG. 1D, the collector region 120 can include single wide bandgap material layer and the emitter region 130 can include a single mid bandgap material layer (i.e., can be devoid of the wide bandgap material). Specifically, the collector region 120 can include collector layer 109. The collector layer 109 can be positioned laterally immediately adjacent to the buffer layer 108a, can be epitaxially, selectively, and laterally grown from the buffer layer 108a so as to be monocrystalline in structure, and can be made of a semiconductor material that has a wider (i.e., larger) bandgap and smaller lattice constant than the buffer layer 108a. Thus, for example, if the base layer 105 is made of silicon germanium and the buffer layer 108a is made of silicon, aluminum phosphide, or gallium phosphide, then the collector layer 109 could be made of silicon carbide, gallium nitride, zinc oxide, aluminum nitride or any other suitable semiconductor material with a wider bandgap and smaller lattice constant that the buffer layers. In this case, the emitter region 130 can be devoid of the wide bandgap material layer and instead can include a single emitter layer 110, which is positioned laterally immediately adjacent to the buffer layer 108b, which is epitaxially, selectively, and laterally grown from the buffer layer 108b so as to be monocrystalline in structure, and which is made of a semiconductor material with a narrower (i.e., smaller) bandgap than the collector layer 109, but still a wider (i.e., larger) bandgap than the base layer 105. Thus, for example, if the base layer 105 is made of silicon germanium, the buffer layer 108b is made of silicon, aluminum phosphide, or gallium phosphide, and the collector layer 109 is made of silicon carbide, gallium nitride, zinc oxide, or aluminum nitride, then the emitter layer 110 could be made of silicon. It should be noted that, in the asymmetric HBT 150D, the collector layer 109 and the emitter layer 110 can be relatively wide and contacted (e.g., see collector/emitter contacts 118).

It should be noted that if the collector layers 109a and 109b in the HBT 150A or 150B of FIGS. 1A and 1B or the collector layer 109 in the HBT 150C or 150D of FIGS. 1C and 1D are made of silicon carbide, then any of the different silicon carbide polytypes could be employed including, but not limited to, 3C, 4H or 6H.

In any case, in each of the embodiments, the layer or layers of the collector region 120 and emitter region 130, as described above, can have the second-type conductivity at a relatively high conductivity level. For example, for an NPN-type HBT, the collector and emitter layers can all be N+ layers; whereas, for a PNP-type HBT, the collector and emitter layers can all be P+ layers. Furthermore, it should be noted that for purposes of illustration, the collector region 120 and the emitter region 130 are shown as being positioned above and immediately adjacent to a planar top surface of the insulator layer 102. However, it should be understood that the figures are not intended to be limiting. Alternatively, one or both of these regions 120 and 130 could fill trenches that extend partially or completely through the insulator layer 102.

Optionally, in each of the embodiments, the HBT 150A-150D could include metal silicide layers 117 between the collector/emitter contacts 118 and the top surfaces of the collector and emitter regions 120 and 130 and further between the base contact 119 and the top surface of base region 140. The metal silicide layers 117 can be, for example, layers of cobalt silicide (CoSi), nickel silicide (NiSi), tungsten silicide (WSi), titanium silicide (TiSi), or any other suitable metal silicide material.

The semiconductor structure 100A-100D can further include one or more dielectric layers covering the HBT. These layers can include, but are not limited to, layers of interlayer dielectric (ILD) material. For example, a first layer 112 of ILD material can cover the collector and emitter regions 120 and 130 and can further be positioned laterally adjacent to the sidewall spacers 111 (i.e., the sidewall spacers 111 can be positioned laterally between the additional base layer 114 and the first layer 112 of ILD material). Additionally, a second layer 115 of ILD material can be on the first layer 112 and can further extend over the sidewall spacers 111 and additional base layer 114. The ILD material of these layers 112 and 115 can be, for example, silicon dioxide, doped silicon glass (e.g., phosphosilicate glass (PSG) or borophosphosilicate glass (BPSG)), or any other suitable ILD material. The base contact 119 can extend through the second layer 115 of ILD material to the optional metal silicide layer 117 on the base region 140 and the collector/emitter contacts 118 can extend through the second layer 115 and the first layer 112 of ILD material to the optional metal silicide layers 117 on the collector and emitter regions 120 and 130.

Figure 2:
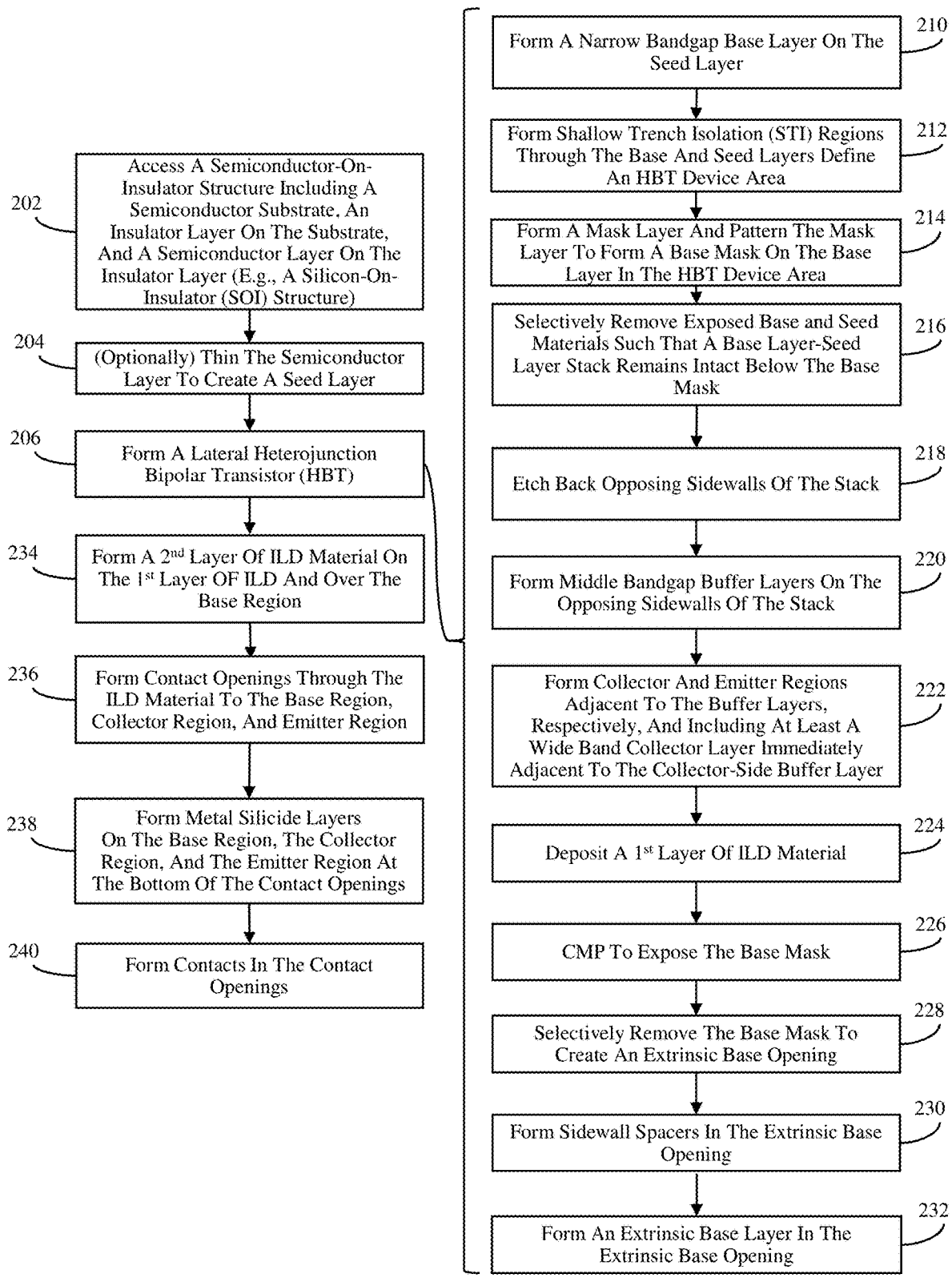
FIG. 2 is a flow diagram illustrating method embodiments for forming the semiconductor structures shown in FIGS. 1A-1D.

Referring to the flow diagram of FIG. 2, also disclosed herein are embodiments of a method for forming a semiconductor structure with a lateral heterojunction bipolar transistor (HBT), such that the semiconductor structure 100A with the lateral symmetric HBT 150A of FIG. 1A, the semiconductor structure 100B with the lateral symmetric HBT 150B of FIG. 1B, the semiconductor structure 100C with the lateral asymmetric HBT 150C of FIG. 1C, or the semiconductor structure 100D with the lateral asymmetric HBT 150D of FIG. 1D.

Figure 3:
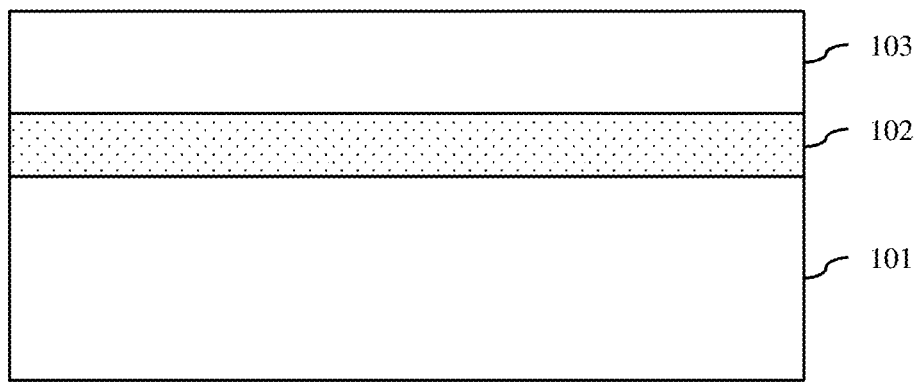
FIGS. 3-10 are cross-section diagrams illustrating partially completed semiconductor structures formed according to the flow diagram of FIG. 2 during manufacture of any of the structures shown in FIGS. 1A-1D.

The method can begin with accessing an initial semiconductor-on-insulator structure (e.g., a silicon-on-insulator (SOI) structure) (see process 202 and FIG. 3). The initial semiconductor-on-insulator structure can include a semiconductor substrate 101. The semiconductor substrate 101 can be, for example, a silicon substrate that is monocrystalline in structure. Optionally, the semiconductor substrate 101 can be doped so as to have P-type conductivity at a relatively low conductivity level. Thus, for example, the semiconductor substrate 101 could be a P− silicon substrate. The initial semiconductor-on-insulator structure can further include an insulator layer 102 on the top surface of the semiconductor substrate 101. The insulator layer 102 can be, for example, a silicon dioxide layer (also referred to herein as a buried oxide (BOX) layer) or a layer of any other suitable insulator material. The initial semiconductor-on-insulator structure can further include a semiconductor layer 103 on the insulator layer 102. The semiconductor layer 103 can be, for example, a silicon layer that is monocrystalline in structure.

Figure 4:
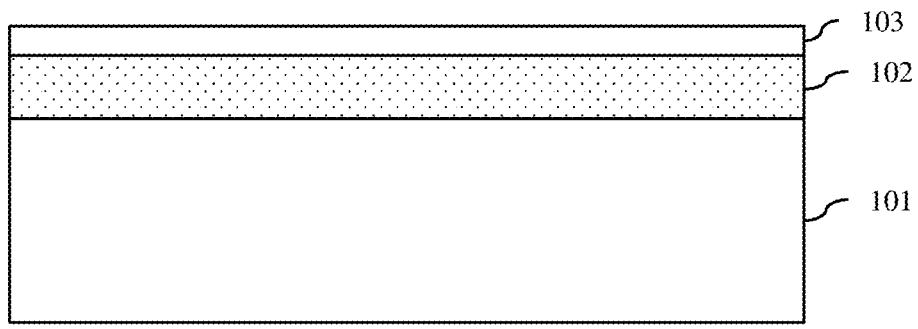

As discussed in greater detail below, the semiconductor layer 103 of the initial semiconductor-on-insulator initial structure will be used during subsequent processing (see process 210) as a seed layer for epitaxial growth of a base layer (e.g., a silicon germanium base layer) for an HBT. Such a seed layer need only be a few nanometers thick (e.g., 1-5 nm). Thus, if the semiconductor layer 103 is relatively thick (e.g., greater than 5 nm) the method can optionally include thinning the semiconductor layer 103 (see process 204 and FIG. 4). Various different techniques for thinning a semiconductor layer are known in the art and can be employed at process 204. One exemplary technique can include oxidizing the upper portion of the semiconductor layer to form an oxide layer (i.e., a silicon dioxide layer) and subsequently selectively removing the resulting oxide layer (e.g., using a buffered hydrofluoric acid (HF) wet etch technique or some other suitable technique for selectively etching silicon dioxide without etching the silicon material below).

The method can further include forming a transistor and, particularly, a lateral heterojunction bipolar transistor (HBT) (e.g., such as any of the HBTs 150A-150D described above) using the seed layer 103 (see process 206). It should be noted that the HBT formed at process 206 can be an NPN-type HBT or, alternatively, a PNP-type HBT. In the below description of process 206 below, reference is made to semiconductor layers and/or regions being doped so as to have a first-type conductivity or a second-type conductivity that is different from the first-type conductivity. It should be understood that the first-type conductivity and the second-type conductivity are either P-type conductivity and N-type conductivity, respectively, or N-type conductivity and P-type conductivity, respectively, depending upon whether the HBT is an NPN-type HBT or a PNP-type HBT. Specifically, if the HBT is an NPN-type HBT, then the first-type conductivity refers to P-type conductivity and the second-type conductivity refers to N-type conductivity. However, if the HBT is a PNP-type HBT, then the first-type conductivity refers to N-type conductivity and the second-type conductivity refers to P-type conductivity. See the detailed discussion below regarding different dopants that can be employed in semiconductor materials to achieve P-type conductivity or N-type conductivity.

Figure 5:
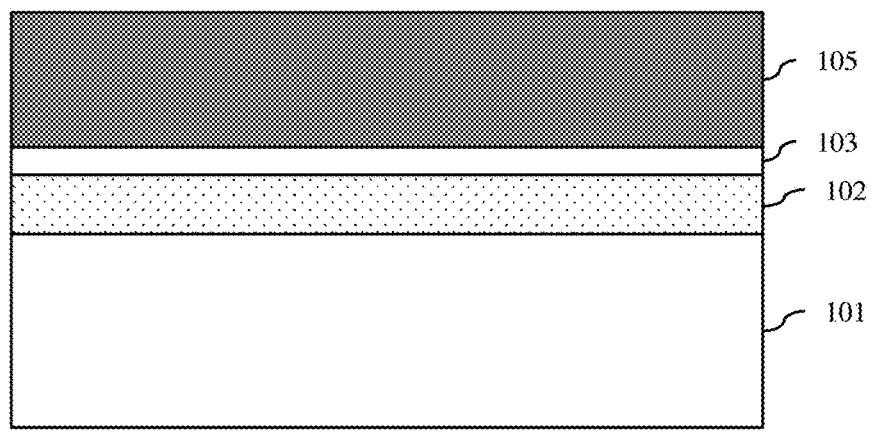

In any case, a base layer 105 can be formed on the seed layer 103 (see process 210 and FIG. 5). The base layer 105 can be formed at process 210, for example, using a selective epitaxially growth process such that it is monocrystalline in structure. The semiconductor material of the base layer 105 can be selected such that it has a relatively narrow (i.e., small) bandgap as compared to, for example, silicon. Thus, the base layer 105 can be, for example, a monocrystalline epitaxial silicon germanium layer. The base layer 105 can be either undoped or in situ doped during epitaxial deposition so as to have the first-type conductivity. For example, for an NPN-type HBT, the base layer 105 can be undoped (i.e., an intrinsic base layer). Alternatively, for an NPN-type HBT, the base layer 105 can be in situ doped at process 210 so as to have P-type conductivity at a relatively low conductivity level (i.e., a P− base layer), so as to have a graded P-type profile (e.g., from undoped or P− at the bottom surface near the seed layer 103 to P or P+ at the top surface), or so as to have P-type conductivity at a relatively high conductivity level (i.e., a P+ base layer). Similarly, for a PNP-type HBT, the base layer 105 can be undoped (i.e., an intrinsic base layer). Alternatively, for a PNP-type HBT, the base layer 105 can be in situ doped at process 210 so as to have N-type conductivity at a relatively low conductivity level (i.e., an N− base layer), so as to have a graded N-type profile (e.g., from undoped or N− at the bottom surface near the seed layer 103 to N or N+ at the top surface), or so as to have N-type conductivity at a relatively high conductivity level (i.e., a N+ base layer).

Figure 6:
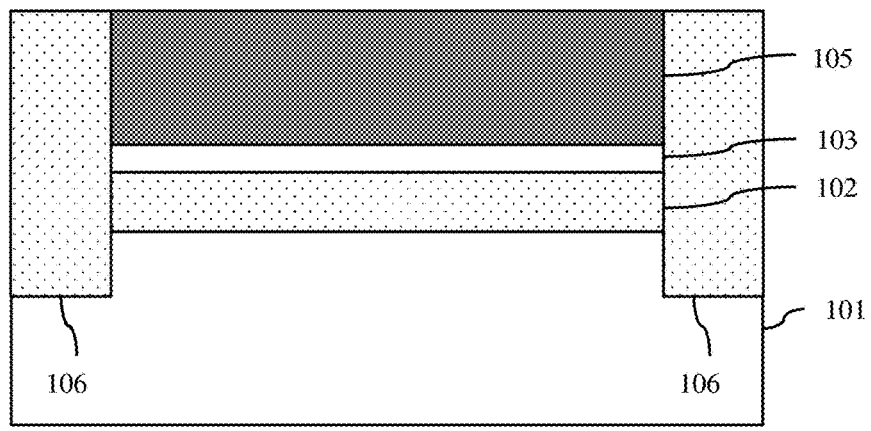

Shallow trench isolation (STI) regions 106 can be formed using conventional STI formation techniques to define the HBT device area (see process 212 and FIG. 6). Specifically, at process 212, trenches can be formed (e.g., lithographically patterned and etched) such that the extend vertically through the base layer 105, through the seed layer 103 and, optionally, through insulator layer 102 and into the substrate 101 below. One or more layers of isolation material (e.g., silicon dioxide, silicon nitride, silicon oxynitride or any other suitable isolation material) can subsequently be deposited so as to fill the trench. A polishing process (e.g., a chemical mechanical polishing (CMP) process can then be performed so as to remove all isolation materials from above the base layer 105.

Figure 7:
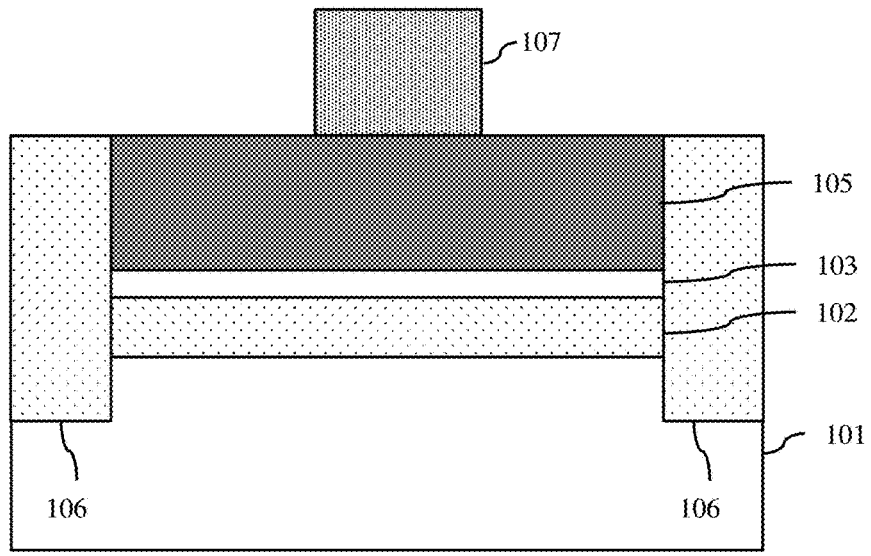

A mask layer (e.g., a silicon nitride hardmask layer or some other suitable hardmask layer) can be formed over the base layer 105 and adjacent STI regions 106 (see process 214). The mask layer can subsequently be lithographically patterned and etched such that the remaining portion of the mask layer (referred to herein as a base mask 107) is on the base layer 105 (e.g., at approximately the center of the HBT device area) (see process 214 and FIG. 7).

Figure 8:
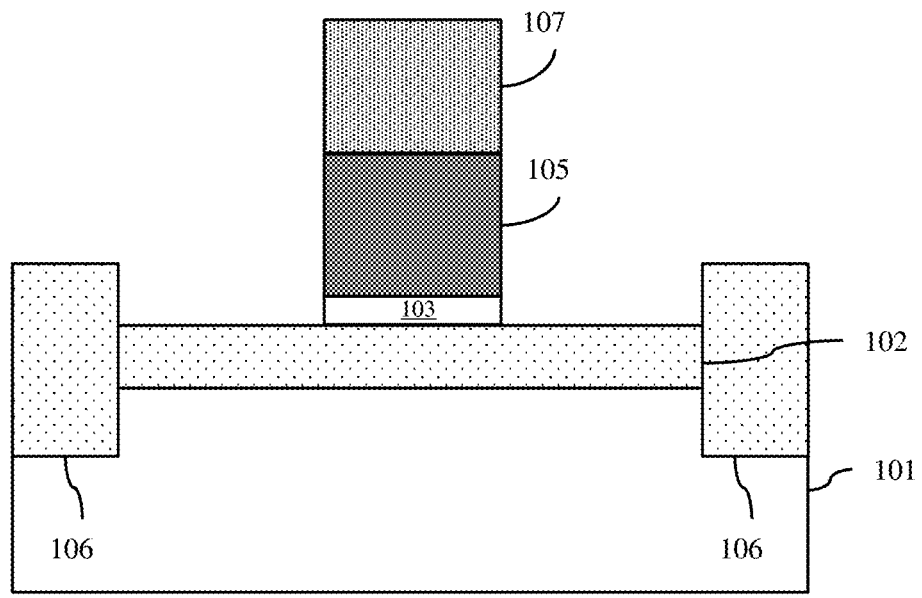

Following formation of the base mask 107, the base and seed materials can be selectively removed from designated collector and emitter areas of the HBT device region, thus, forming a base layer-seed layer stack at approximately the center of the HBT device region (see process 216 and FIG. 8). Process 216 can be performed using one or more anisotropic etch processes that is/are selective for the semiconductor materials of the base layer 105 and seed layer 103 over the adjacent isolation materials. Various different techniques for selectively and anisotropically etching semiconductor materials are known in the art and could be employed at process 216. For example, a potassium hydroxide (KOH) wet etch process could be employed to selectively and anisotropically etch both a silicon germanium base layer and a silicon seed layer below. For purposes of illustration, this etch process is illustrated in FIG. 8 as stopping on the top surface of the insulator layer 102. However, it should be understood that the figures are not intended to be limiting. Alternatively, processing can be performed so that the isolation layer is also partially or even completely etched through on one or both sides of the base stack.

Figure 9:
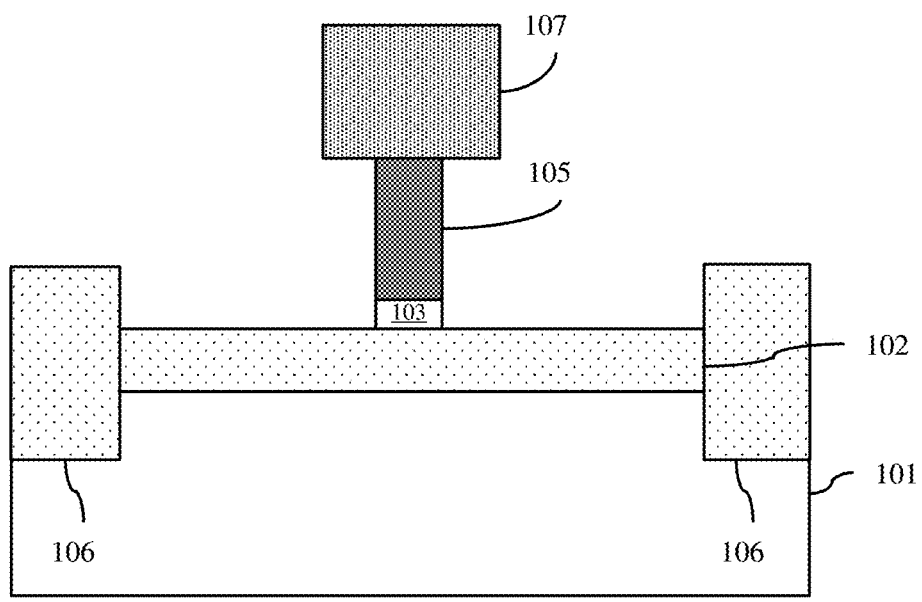

Optionally, the opposing sidewalls of the base stack (e.g., including vertical surfaces of both the seed layer 103 and the base layer 105 thereon) can be etched back, thereby reducing the width of the base stack (see process 218 and FIG. 9). Various different techniques are known in the art and could be employed at process 218. For example, the sidewalls of the base stack could be oxidized, thereby forming an oxide layer. Then, the oxide layer could be selectively removed. It should be understood that, if the insulator layer 102 is an oxide layer, it would also be etched to some extent. Alternatively, a selective isotropic etch process (e.g., a dry chemical etch process) could be performed to etch back the sidewalls of the base stack.

Figure 10:
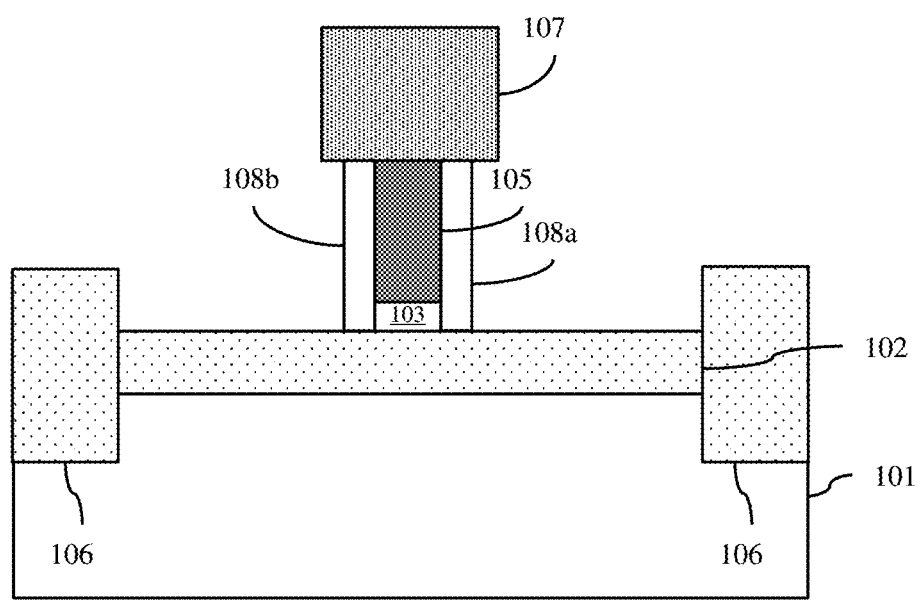

Thin buffer layers 108a-108b can subsequently be formed so as to cover the opposing sidewalls of base stack (see process 220 and FIG. 10). The buffer layers 108a and 108b can be concurrently selectively epitaxially grown from the opposing sidewalls of the base layer 105-seed layer 103 stack (or otherwise formed, such as by chemical vapor deposition) such that they are monocrystalline in structure. The semiconductor material of the buffer layers 108a and 108b can specifically be selected at process 220 so as to have a wider (i.e., larger) bandgap than the base layer 105, but so as to also have an equal or approximately equal lattice constant. Thus, for example, if the base layer 105 is a silicon germanium layer, then the semiconductor material of the buffer layers 108a and 108b could be silicon, aluminum phosphide, gallium phosphide, or any other suitable semiconductor material with a larger bandgap but similar lattice constant as compared to silicon germanium. In any case, the buffer layers 108a and 108b can be in situ doped so as to have a second-type conductivity, which is different from the first-type conductivity and which is at a relatively low conductivity level. For example, for an NPN-type HBT, the buffer layers 108a and 108b can be in situ doped so as to be N– buffer layers (e.g., effectively forming N– collector/emitter extension regions); whereas, for a PNP-type HBT, the buffer layers 108a and 108b can be in situ doped so as to be P– buffer layers (e.g., effectively forming P– collector/emitter extension regions).

The method can further include forming a collector region 120 and an emitter region 130 such that the base layer 105 is positioned laterally between the collector region 120 and the emitter region 130 and further such that at least the collector region 120 include a wide bandgap semiconductor material layer positioned laterally immediately adjacent to the buffer layer 108a (see process 222). The techniques used to form the collector region 120 and the emitter region 130 will vary depending upon the semiconductor structure being formed. For example, process steps for forming the emitter region 130 and the collector region 120 can be performed concurrently if the HBT is to be symmetric as illustrated in FIGS. 1A and 1B. Alternatively, the process steps for forming the emitter region 130 and the collector region 120 can be performed sequentially so that the resulting HBT can be asymmetric as illustrated in FIGS. 1C and 1D. Process steps can also vary depending upon whether the collector region 120 will have two collector layers as illustrated in FIGS. 1A and 1C or a single collector layer as illustrated in FIGS. 1B and 1D.

For example, during formation of the collector and emitter regions 120 and 130 of the symmetric HBT 150A in the semiconductor structure 100A of FIG. 1A, collector and emitter layers 109a and 109b can be epitaxially, selectively, and laterally grown from the buffer layers 108a and 108b, respectively, such that they are monocrystalline in structure (see FIG. 11A(1)). The collector and emitter layers 109a and 109b can be made of a semiconductor material that has a wider (i.e., larger) bandgap and smaller lattice constant than the buffer layers. Thus, for example, if the base layer 105 is made of silicon germanium and the buffer layers 108a and 108b are made of silicon, aluminum phosphide, or gallium phosphide, then the collector and emitter layers 109a and 109b could be made of silicon carbide, gallium nitride, zinc oxide, aluminum nitride or any other suitable semiconductor material with a wider bandgap and smaller lattice constant that the buffer layers. As illustrated, the collector and emitter layers 109a and 109b can be relatively thin and essentially vertically-oriented. Furthermore, additional collector and emitter layers 110a and 110b can be epitaxially, selectively, and laterally grown from the collector and emitter layers 109a and 109b such that they are also monocrystalline in structure (see FIG. 11A(2)). The additional collector and emitter layers 110a and 110b can be made of a semiconductor material with a narrower (i.e., smaller) bandgap than the collector and emitter layers 109a and 109b, but still a wider (i.e., larger) bandgap than the base layer 105. Thus, for example, if the base layer 105 is made of silicon germanium, the buffer layers 108a and 108b are made of silicon, aluminum phosphide, or gallium phosphide, and the collector and emitter layers 109a and 109b are made of silicon carbide, gallium nitride, zinc oxide, or aluminum nitride, then the additional collector and emitter layers 110a and 110b could be made of silicon. Thus, in this partially completed semiconductor structure, both the collector region and the emitter region include a wide bandgap semiconductor material layer. It should be noted that in this case the additional collector and emitter layers 110a and 110b can be formed so that they are relatively wide as compared to the collector and emitter layers 109a and 109b, so that they fill the space between the collector and emitter layers and the adjacent STI regions, and so that they can subsequently be contacted.

Figure 11B:
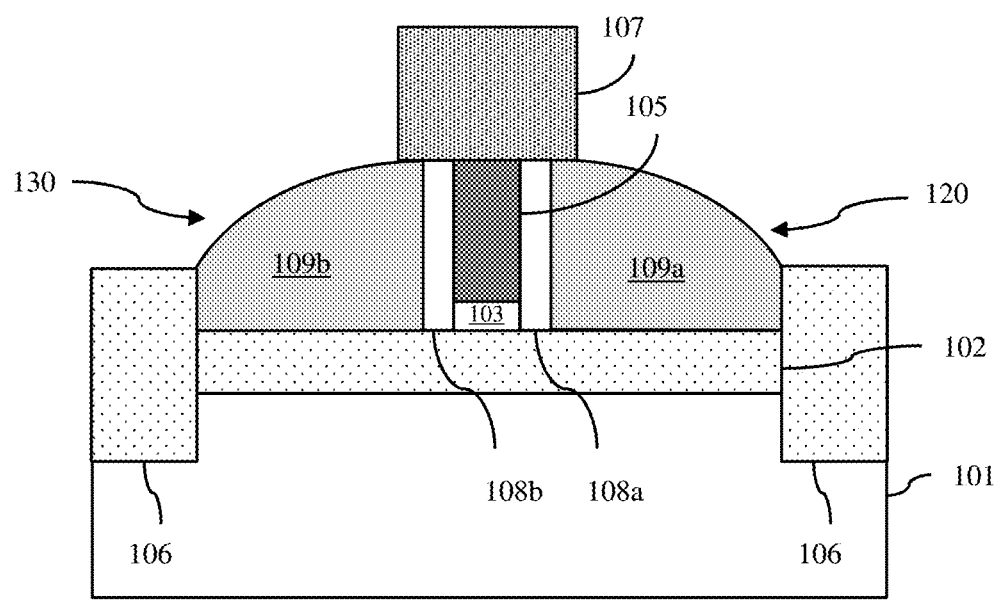
FIG. 11B is cross-section diagram illustrating a partially completed semiconductor structure formed at process 222 specifically during manufacture of the structure shown in FIG. 1B.

During formation of the collector and emitter regions 120 and 130 of the symmetric HBT 150B in the semiconductor structure 100B of FIG. 1B, relatively wide collector and emitter layers 109a and 109b can be epitaxially, selectively, and laterally grown from the buffer layers 108a and 108b so that they are monocrystalline in structure (see FIG. 11B). Thus, the collector and emitter regions each only contain a single semiconductor layer. As in the previously described embodiment, the collector and the emitter layers 109a and 109b can be made of a semiconductor material that has a wider (i.e., larger) bandgap and smaller lattice constant than the buffer layers. Thus, for example, if the base layer 105 is made of silicon germanium and the buffer layers 108a and 108b are made of silicon, aluminum phosphide, or gallium phosphide, then the collector and emitter layers 109a and 109b could be made of silicon carbide, gallium nitride, zinc oxide, aluminum nitride or any other suitable semiconductor material with a wider bandgap and smaller lattice constant that the buffer layers 108a and 108b. Thus, in this partially completed semiconductor structure, both the collector region and the emitter region include a wide bandgap semiconductor material layer. It should be noted that in this case the collector and emitter layers 109a and 109b can be formed so that they are relatively wide, so that they extend to the adjacent STI regions, and so that they can be contacted during subsequent processing.

During formation of the collector and emitter regions 120 and 130 of the asymmetric HBT 150C in the semiconductor structure 100C of FIG. 1C, a protective layer 199 can be formed in the designated emitter area so as to cover emitter-side sidewall of the base stack and leave the collector-side sidewall of the base stack exposed (see FIG. 11C(1). Then, a collector layer 109 for the collector region 120 can be epitaxially, selectively, and laterally grown from the buffer layer 108a such that it is monocrystalline in structure (see FIG. 11C(1)). The collector layer 109 can be made of a semiconductor material that has a wider (i.e., larger) bandgap and smaller lattice constant than the buffer layer 108a. Thus, for example, if the base layer 105 is made of silicon germanium and the buffer layer 108a is made of silicon, aluminum phosphide, or gallium phosphide, then the collector layer 109 could be made of silicon carbide, gallium nitride, zinc oxide, aluminum nitride or any other suitable semiconductor material with a wider bandgap and smaller lattice constant that the buffer layers. The collector layer 109 can further be relatively thin and essentially vertically-oriented. The protective layer 199 can then be selectively removed and an additional collector layer 110a for the collector region 120 and an emitter layer 110b for the emitter region 130 can be epitaxially, selectively, and laterally grown from the collector layer 109 and buffer layer 108b, respectively, so that these layers are monocrystalline in structure (see FIG. 11C(2)). In this case, the emitter layer 110 and the additional collector layer 109b can be made of a semiconductor material with a narrower (i.e., smaller) bandgap than the collector layer 109, but still a wider (i.e., larger) bandgap than the base layer 105. Thus, for example, if the base layer 105 is made of silicon germanium, the buffer layers 108a and 108b are made of silicon, aluminum phosphide, or gallium phosphide, and the collector layer 109 is made of silicon carbide, gallium nitride, zinc oxide, or aluminum nitride, then the additional collector layer 110a and the emitter layer 110b could be made of silicon. Thus, in this partially completed semiconductor structure, the emitter region 130 is devoid of the wide bandgap material layer. Furthermore, it should be noted that in this case the additional collector layer 109b and emitter layer 110 can be formed so that they are relatively wide, so that they extend to the adjacent STI regions, and so that they can be contacted during subsequent processing.

During formation of the collector and emitter regions 120 and 130 of the asymmetric HBT 150D in the semiconductor structure 100D of FIG. 1D, a protective layer 198 can be formed in the designated emitter area so as to cover emitter-side sidewall of the base stack and so as to leave the collector-side sidewall of the base stack exposed (see FIG. 11D(1)). Then, a collector layer 109 for the collector region 120 can be epitaxially, selectively, and laterally grown from the buffer layer 108a such that it is monocrystalline in structure (see FIG. 11D(1)). The collector layer 109 can be made of a semiconductor material that has a wider (i.e., larger) bandgap and smaller lattice constant than the buffer layer 108a. Thus, for example, if the base layer 105 is made of silicon germanium and the buffer layer 108a is made of silicon, aluminum phosphide, or gallium phosphide, then the collector layer 109 could be made of silicon carbide, gallium nitride, zinc oxide, aluminum nitride or any other suitable semiconductor material with a wider bandgap and smaller lattice constant that the buffer layers. Furthermore, it should be noted that in this case the collector layer 109 can be formed so that it is relatively wide, so that that it extends to the adjacent STI region, and so that it can be contacted during subsequent processing. Following formation of the collector layer 109, the protective layer 198 can be selectively removed and an additional protective layer 196 can be formed so as to cover the collector layer 109 and so as to leave the emitter-side sidewall of the base stack exposed (see FIG. 11D(2)). Next, an emitter layer 110 can be epitaxially, selectively, and laterally grown from the buffer layer 108b such that it is monocrystalline in structure (see FIG. 11D(2)). The emitter layer 110 can be made of a semiconductor material with a narrower (i.e., smaller) bandgap than the collector layer 109, but still a wider (i.e., larger) bandgap than the base layer 105. Thus, for example, if the base layer 105 is made of silicon germanium, the buffer layers 108a and 108b are made of silicon, aluminum phosphide, or gallium phosphide, and the collector layer 109 is made of silicon carbide, gallium nitride, zinc oxide, or aluminum nitride, then the emitter layer 110 could be made of silicon. Following formation of the emitter layer 110, the protective layer 196 can be selective removed (see FIG. 11D(3)). In this partially completed semiconductor structure, the emitter region 130 is devoid of the wide bandgap material layer. Furthermore, it should be noted that in this case the collector layer 109 and emitter layer 110 can be formed so that they are relatively wide, so that they extend to the adjacent STI regions, and so that they can be contacted during subsequent processing.

In any case, in each of the embodiments, the layer or layers of the collector region 120 and emitter region 130, which are epitaxially deposited at process 222 as described above, can be in situ doped so as to have the second-type conductivity at a relatively high conductivity level. For example, for an NPN-type HBT, the collector and emitter layers can all be in N+ layers; whereas, for a PNP-type HBT, the collector and emitter layers can all be P+ layers.

The remaining processes are described below and illustrated in the figures with respect to the partially completed semiconductor structure shown in FIG. 11A(2) and formation of the semiconductor structure 100A with the symmetric HBT 150A shown in FIG. 1A. However, it should be understood that these same process steps could be performed with respect to the partially completed semiconductor structures shown in FIGS. 11B, 11C(2) and 11D(3) to form the HBTs 150B, 150C and 150D shown in FIGS. 1B, 1C and 1D, respectively.

Figure 12:
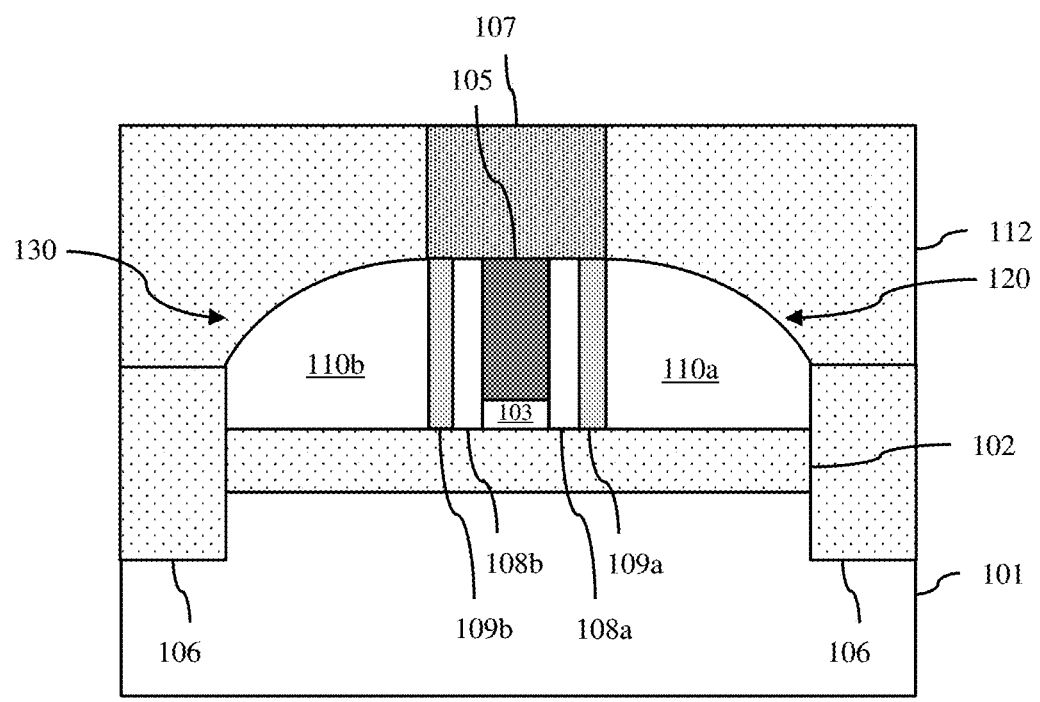
FIGS. 12-19 are cross-section diagrams illustrating partially completed semiconductor structures illustrating the remaining processes of the flow diagram of FIG. 2 (e.g., with respect to the structure shown in FIG. 1A.
Figure 13:
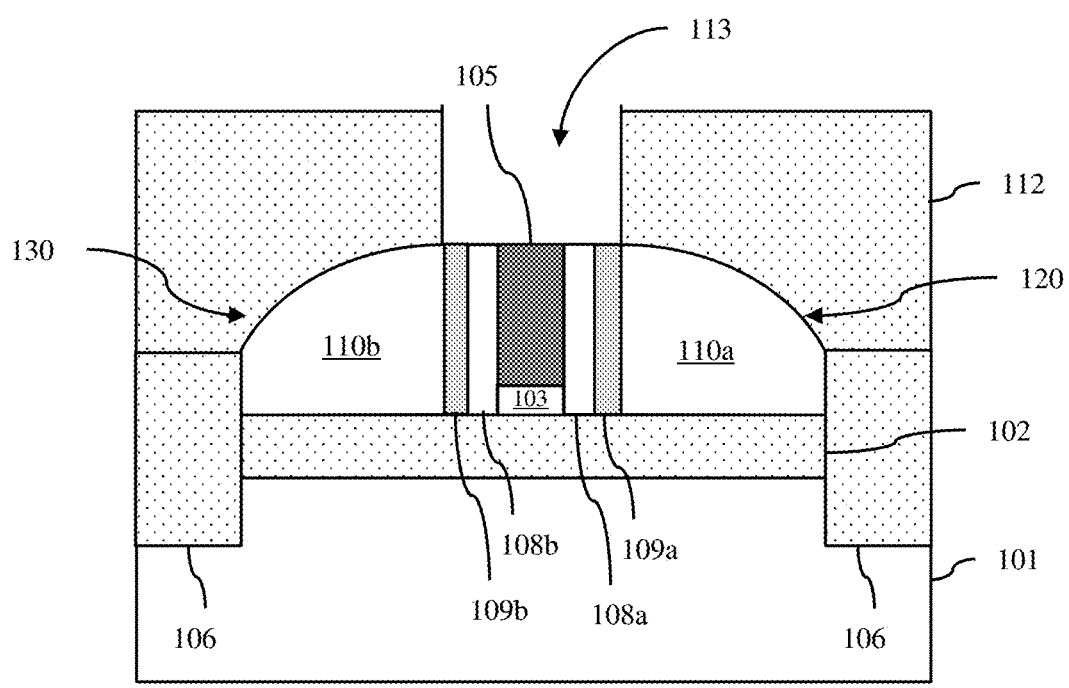

For example, a first layer 112 of interlayer dielectric (ILD) material can be deposited so as to cover the collector region 120, the base mask 107, and the emitter region 130 (see process 224 and FIG. 12). The ILD material of the layer 112 can be, for example, silicon dioxide, doped silicon glass (e.g., phosphosilicate glass (PSG) or borophosphosilicate glass (BPSG)), or any other suitable ILD material. This first layer 112 can then be polished (e.g., using a CMP process) to expose the top surface of the base mask 107 (see process 226 and FIG. 12). The exposed base mask 107 can then be selectively removed (see process 228 and FIG. 13). It should be understood that the ILD material of layer 112 should be different from the hard mask material (e.g., silicon nitride) of the base mask 107 so that this base mask can be selectively removed using, for example, a plasma etch or other suitable selective etch process. In any case, removal of the base mask 107 creates an extrinsic base opening 113 aligned above the base layer 105 and extending laterally over at least a portion of the adjacent buffer layers 108a and 108b.

Figure 14:
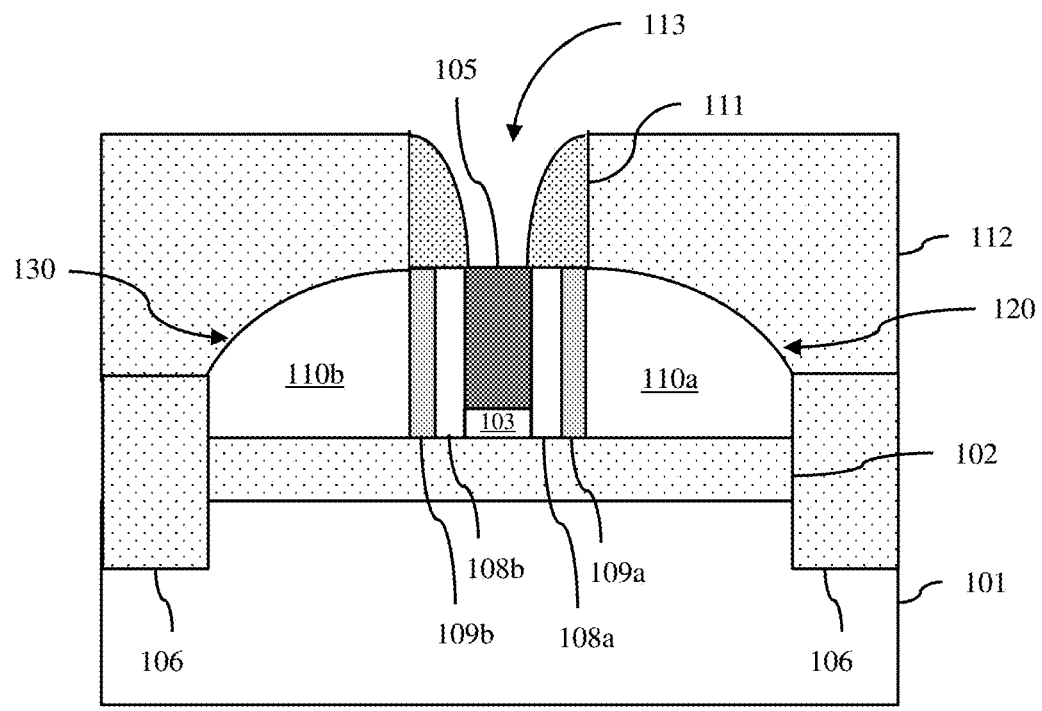

Optionally, the width of this extrinsic base opening 113 can be narrowed by the formation of sidewalls spacers 111 (see process 230 and FIG. 14). For example, a dielectric sidewall spacer material layer can be deposited (e.g., conformally) over the partially completed structure so as to line the extrinsic base opening 113. The dielectric sidewall spacer material layer can be, for example, a silicon nitride layer, a silicon carbon nitride layer, a silicon boron carbon nitride layer or any other suitable dielectric sidewall spacer material layer. Next, a selective anisotropic etch process can be performed so as to remove horizontal portions of the dielectric sidewall spacer material layer, leaving essentially vertical portions intact within the extrinsic base opening 113 as sidewall spacers 111.

Figure 15:
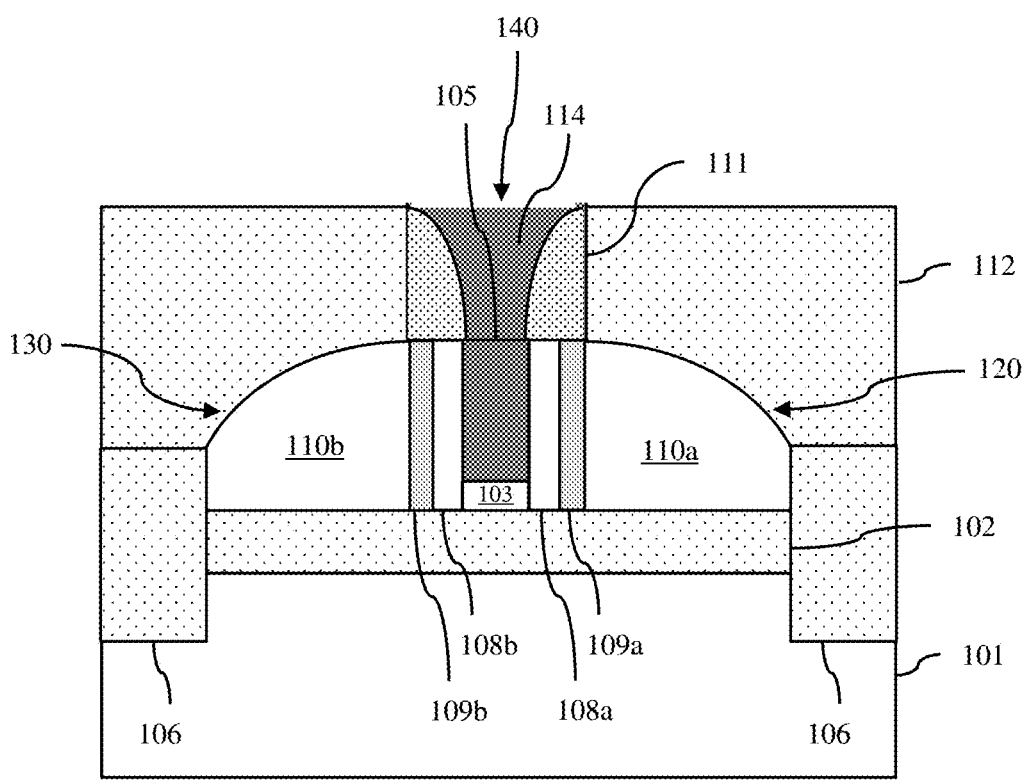

An additional base layer 114 (also referred to herein as an extrinsic base layer) can subsequently be formed (e.g., epitaxially grown) in the extrinsic base opening 113 above and immediately adjacent to the base layer 105 and positioned laterally between and immediately adjacent to the sidewall spacers 111 (see process 232 and FIG. 15). This additional base layer 114 can be selectively grown at process 232 from the top surface of the base layer 105 only during processing such that it is monocrystalline in structure. Alternatively, this additional base layer 114 can be non-selectively grown at process 232 from both the top surface of the base layer 105 and from the sidewall spacers such that it is polycrystalline in structure. The additional base layer 114 can be made of the same semiconductor material as the base layer 105 (e.g., silicon germanium) such that it too has a relatively narrow bandgap as compared to, for example, silicon. Alternatively, the additional base layer 114 can be made of a different semiconductor material that the base layer 105 (e.g., silicon). In any case, the additional base layer 114 can be in situ doped so as to have the first-type conductivity at a relatively high conductivity level. For example, for an NPN-type HBT, the additional base layer 114 can be a P+ base layer; whereas, for a PNP-type HBT, the additional base layer 114 can be an N+ base layer.

Figure 16:
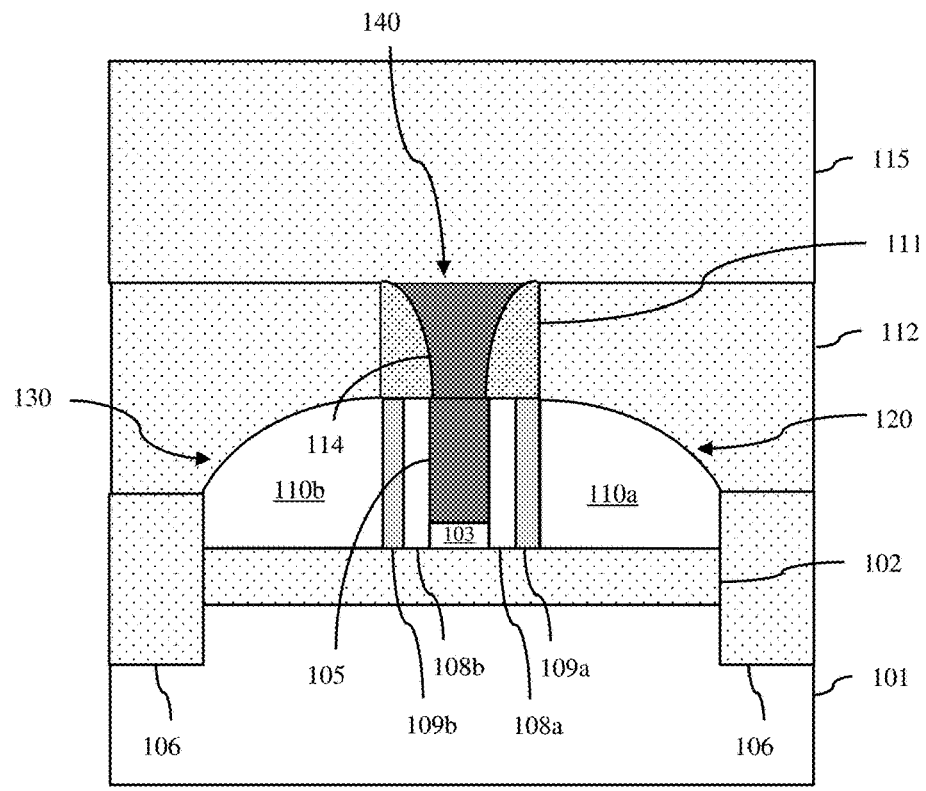

Following formation of the additional base layer 114 (and thereby completion of the base region 140), a second layer 115 of ILD material can be formed on the first layer 112 and extending over the sidewall spacers 111 and additional base layer 114 (see process 234 and FIG. 16). The second layer 115 can be made of the same ILD material as the first layer 112 or, alternatively, a different ILD material. That is, the ILD material of the second layer 115 can be any of silicon dioxide, doped silicon glass (e.g., phosphosilicate glass (PSG) or borophosphosilicate glass (BPSG)), or any other suitable ILD material.

Figure 17:
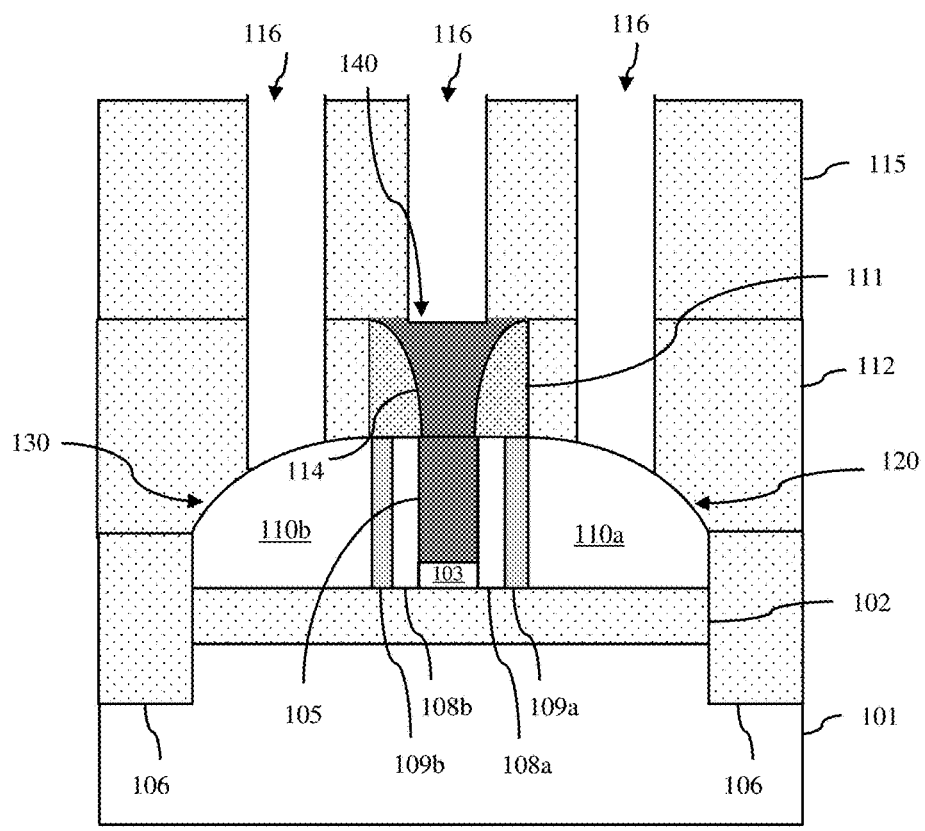
Figure 18:
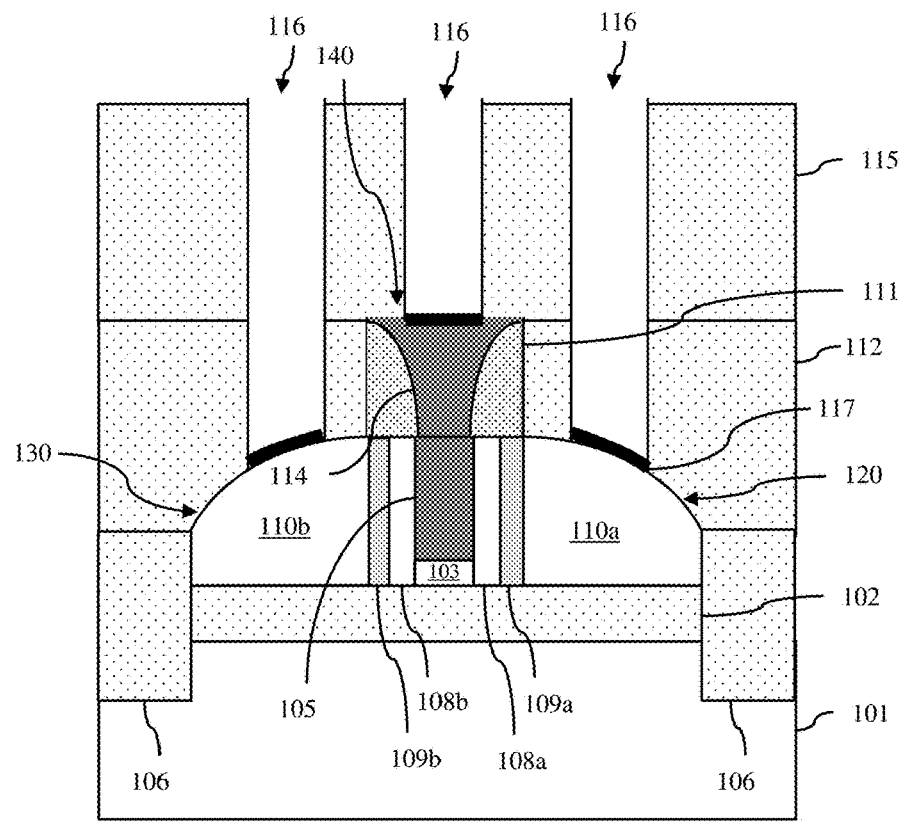
Figure 19:
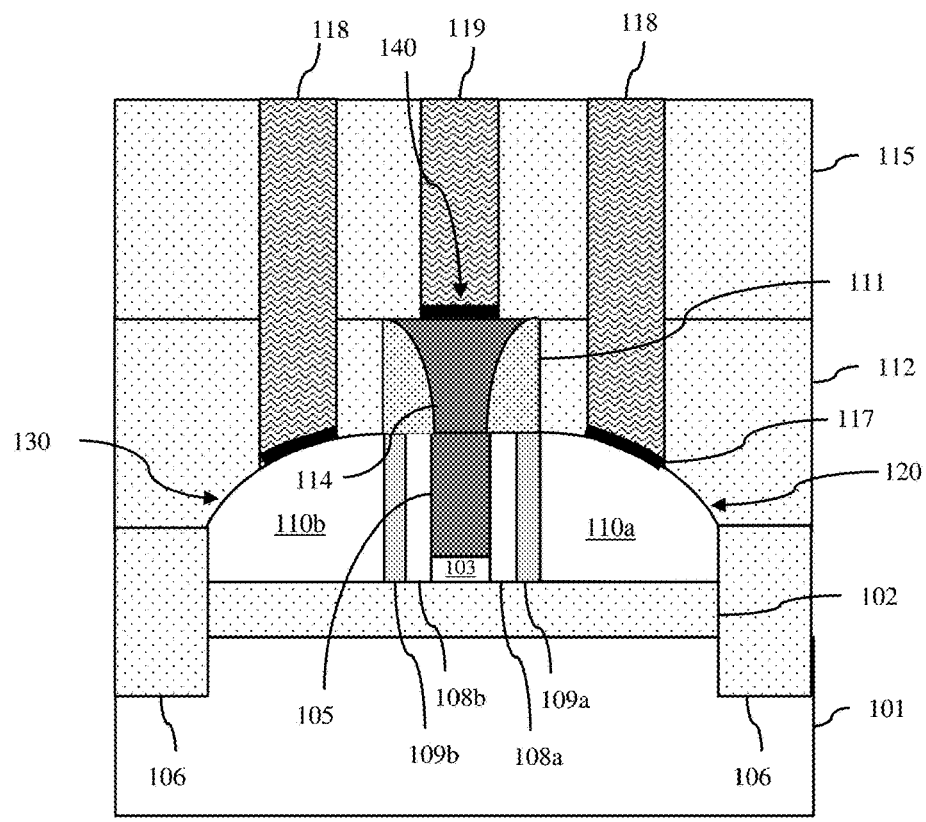

Contact openings 116 can subsequently be formed (e.g., patterned and etched) (see process 236 and FIG. 17). The contact openings 116 can include a base contact opening that extends through the second layer 115 of ILD material to the top surface of the base region 140 and collector/emitter contact openings that extend through the second layer 115 and the first layer 112 of ILD material to the collector and emitter regions 120 and 130. Optionally, metal silicide layer 117 can be formed on exposed surfaces of the collector region 120, base region 140 and emitter region 130 at the bottom of the contact openings (e.g., using a self-aligned silicide formation process, also referred to herein as a salicide formation process) (see process 238 and FIG. 18). The metal silicide layers 117 can be, for example, layers of cobalt silicide (CoSi), nickel silicide (NiSi), tungsten silicide (WSi), titanium silicide (TiSi), or any other suitable metal silicide material. Then, conventional middle-of-the-line (MOL) contacts can be formed including a base contact 119 in the base contact opening and collector/emitter contacts 118 in the collector/emitter contact openings (see process 240 and FIG. 19).

It should be understood that in the method and structures described above, a semiconductor material refers to a material whose conducting properties can be altered by doping with an impurity. Exemplary semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing conductivity (i.e., an undoped semiconductor material) is referred to in the art as an intrinsic semiconductor. A semiconductor material that is doped with an impurity for the purposes of increasing conductivity (i.e., a doped semiconductor material) is referred to in the art as an extrinsic semiconductor and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, it should be understood that different impurities (i.e., different dopants) can be used to achieve different conductivity types (e.g., P-type conductivity and N-type conductivity) and that the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in a given semiconductor region.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
a base region comprising a base layer;
a buffer layer positioned laterally immediately adjacent to the base layer; and
a collector region comprising a collector layer positioned laterally immediately adjacent to the buffer layer, wherein the base layer, the buffer layer, and the collector layer comprise different semiconductor materials with different bandgap sizes, wherein the buffer layer has a larger bandgap than the base layer.

2. The structure of claim 1, wherein the buffer layer has a smaller bandgap than the collector layer.

3. The structure of claim 1, wherein the base layer and the buffer layer have approximately equal lattice constants and wherein the collector layer has a smaller lattice constant than the buffer layer.

4. The structure of claim 1, further comprising an emitter region, wherein the base region is positioned laterally between the collector region and the emitter region and wherein the emitter region and the collector region are symmetric.

5. The structure of claim 1, further comprising an emitter region, wherein the base region is positioned laterally between the collector region and the emitter region and wherein the emitter region and the collector region are asymmetric.

6. The structure of claim 1, further comprising an additional base layer above and immediately adjacent to the base layer and further positioned laterally between sidewall spacers.

7. The structure of claim 6, further comprising:
an insulator layer;
a seed layer on the insulator layer, wherein the base layer is on the seed layer; and
a contact on the collector layer.

8. The structure of claim 7,
wherein the seed layer, the base layer, and the additional base layer have a first-type conductivity with the seed layer having a lower first-type conductivity level than the base layer and the additional base layer,
wherein the buffer layer and the collector layer have a second-type conductivity that is different from the first-type conductivity with the buffer layer having a lower second-type conductivity level than the collector layer,
wherein the base layer and the additional base layer comprise silicon germanium,
wherein the buffer layer comprises any of silicon, aluminum phosphide, and gallium phosphide,
wherein the collector layer comprises any of silicon carbide, gallium nitride, zinc oxide, and aluminum nitride, and
wherein the seed layer comprises silicon.

9. A structure comprising:
a base region comprising a base layer;
a buffer layer positioned laterally immediately adjacent to the base layer; and
a collector region comprising: a collector layer positioned laterally immediately adjacent to the buffer layer and an additional collector layer positioned laterally immediately adjacent to the collector layer, wherein the base layer, the buffer layer, and the collector layer comprise different semiconductor materials with different bandgap sizes.

10. The structure of claim 9, wherein the buffer layer has a larger bandgap than the base layer and a smaller bandgap than the collector layer.

11. The structure of claim 9, wherein the base layer and the buffer layer have approximately equal lattice constants and wherein the collector layer has a smaller lattice constant than the buffer layer.

12. The structure of claim 9, further comprising an emitter region, wherein the base region is positioned laterally between the collector region and the emitter region and wherein the emitter region and the collector region are symmetric.

13. The structure of claim 9, further comprising an emitter region, wherein the base region is positioned laterally between the collector region and the emitter region and wherein the emitter region and the collector region are asymmetric.

14. The structure of claim 9, further comprising an additional base layer above and immediately adjacent to the base layer and further positioned laterally between sidewall spacers.

15. The structure of claim 14, further comprising:
an insulator layer;
a seed layer on the insulator layer, wherein the base layer is on the seed layer; and
a contact on the additional collector layer,
wherein the seed layer, the base layer, and the additional base layer have a first-type conductivity with the seed layer having a lower first-type conductivity level than the base layer and the additional base layer,
wherein the buffer layer, the collector layer, and the additional collector layer have a second-type conductivity that is different from the first-type conductivity with the buffer layer having a lower second-type conductivity level than the collector layer and the additional collector layer,
wherein the base layer and the additional base layer comprise silicon germanium,
wherein the buffer layer comprises any of silicon, aluminum phosphide, and gallium phosphide,
wherein the collector layer comprises any of silicon carbide, gallium nitride, zinc oxide, and aluminum nitride, and
wherein the seed layer and the additional collector layer comprise silicon.

16. A method comprising:
forming a base region comprising a base layer;
forming a buffer layer positioned laterally immediately adjacent to the base layer; and
forming a collector region comprising a collector layer positioned laterally immediately adjacent to the buffer layer, wherein the forming of the base region, the forming of the buffer layer and the forming of the collector region are performed so that the base layer, the buffer layer, and the collector layer comprise different semiconductor materials with different bandgap sizes, wherein the buffer layer has a larger bandgap than the base layer.

17. The method of claim 16, wherein the buffer layer has a smaller bandgap than the collector layer.

18. The method of claim 16, wherein the collector region further comprises an additional collector layer positioned laterally immediately adjacent to the collector layer.

19. The method of claim 16,
wherein a semiconductor layer of a semiconductor-on-insulator structure comprises a seed layer,
wherein the base layer is formed on the seed layer,
wherein the method further comprises:
forming a base mask on the base layer;
removing exposed base and seed materials such that a base layer-seed layer stack remains below the base mask;
etching back opposing sidewalls of the stack;
forming buffer layers on the opposing sidewalls; and
forming the collector region and an emitter region adjacent to the buffer layers, respectively.

20. The method of claim 19, wherein the collector region and the emitter region are formed any of:
concurrently such that the collector region and the emitter region are symmetric; and
sequentially and such that the collector region and the emitter region are asymmetric.

* * * * *